(12) United States Patent
Yonemura et al.

(10) Patent No.: US 9,728,709 B2
(45) Date of Patent: Aug. 8, 2017

(54) PIEZOELECTRIC ELEMENT, PIEZOELECTRIC ACTUATOR DEVICE, LIQUID EJECTING HEAD, LIQUID EJECTING APPARATUS, AND ULTRASONIC WAVE MEASUREMENT APPARATUS

(71) Applicant: Seiko Epson Corporation, Tokyo (JP)

(72) Inventors: Takayuki Yonemura, Suwa (JP); Yasuhiro Itayama, Chino (JP); Chikara Kojima, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/118,222

(22) PCT Filed: Mar. 18, 2015

(86) PCT No.: PCT/JP2015/001518
§ 371 (c)(1),
(2) Date: Aug. 11, 2016

(87) PCT Pub. No.: WO2015/141223
PCT Pub. Date: Sep. 24, 2015

(65) Prior Publication Data
US 2017/0148974 A1 May 25, 2017

(30) Foreign Application Priority Data

Mar. 18, 2014 (JP) ................................. 2014-055580
Dec. 17, 2014 (JP) ................................. 2014-255509

(51) Int. Cl.
*B41J 2/045* (2006.01)
*H01L 41/18* (2006.01)
(Continued)

(52) U.S. Cl.
CPC .......... *H01L 41/183* (2013.01); *B06B 1/0603* (2013.01); *B06B 1/0644* (2013.01);
(Continued)

(58) Field of Classification Search
CPC . B41J 2/14201; B41J 2/14233; B41J 2/04581
See application file for complete search history.

(56) References Cited

U.S. PATENT DOCUMENTS

| 7,591,543 B2 | 9/2009 | Aoki et al. |
| 7,948,154 B2 | 5/2011 | Ifuku et al. |
| (Continued) | | |

FOREIGN PATENT DOCUMENTS

| JP | 2001223404 A | 8/2001 |
| JP | 2007088444 A | 4/2007 |
| JP | 2008024532 A | 2/2008 |

OTHER PUBLICATIONS

Kobayashi, Takeshi et al., "Effects of Bipolar Pulse Poling on the Ferroelectric and Piezoelectric Properties of Tetragonal Compsition $Pb(Zr_{0.3},Ti_{0.7})O_3$ Thin Films on Microelectromechanical Systems Microcantilevers", Japanese Journal of Applied Physics (2013), Sep. 20, 2013, p. 1-6, vol. 52, The Japan Society of Applied Physics, 2013.

(Continued)

*Primary Examiner* — Juanita D Jackson
(74) *Attorney, Agent, or Firm* — Harness, Dickey & Pierce, P.L.C.

(57) ABSTRACT

A piezoelectric element in which a first electrode, a piezoelectric body layer comprised of a composite oxide having a perovskite structure that includes at least Pb, Nb and Ti, and a second electrode are sequentially laminated on a substrate, in which a crystal that configures the piezoelectric body layer has a tetragonal structure, and the crystal is {100} oriented to the substrate, and in which a region having a (100) plane and a region having a (001) plane that are perpendicular with respect to a direction of lamination, are mixed inside a lattice of the crystal.

19 Claims, 15 Drawing Sheets

(51) Int. Cl.
    *H01L 41/047*    (2006.01)
    *B06B 1/06*      (2006.01)
    *B41J 2/14*      (2006.01)
(52) U.S. Cl.
    CPC ....... *B41J 2/04581* (2013.01); *B41J 2/14201* (2013.01); *H01L 41/047* (2013.01)

(56) References Cited

U.S. PATENT DOCUMENTS

| | | |
|---|---|---|
| 2005/0206275 A1 | 9/2005 | Radziemski et al. |
| 2008/0012054 A1 | 1/2008 | Ifuku et al. |
| 2008/0074471 A1 | 3/2008 | Sakashita et al. |
| 2008/0265718 A1 | 10/2008 | Sakashita et al. |
| 2009/0152996 A1 | 6/2009 | Koizumi et al. |
| 2010/0259574 A1* | 10/2010 | Sumi .................. B41J 2/04581 347/10 |

OTHER PUBLICATIONS

Ehara, Yoshitaka et al., "Phase Boundary Shift by Thermal Strain in {100}-Oriented Epitaxial Pb(ZrxT$_{i1-x}$)O$_3$ Film Grown on CaF$_2$ Substrates", Japanese Journal of Applied Physics (2013), Sep. 20, 2013, p. 1-5, vol. 52, The Japan Society of Applied Physics, 2013.

* cited by examiner

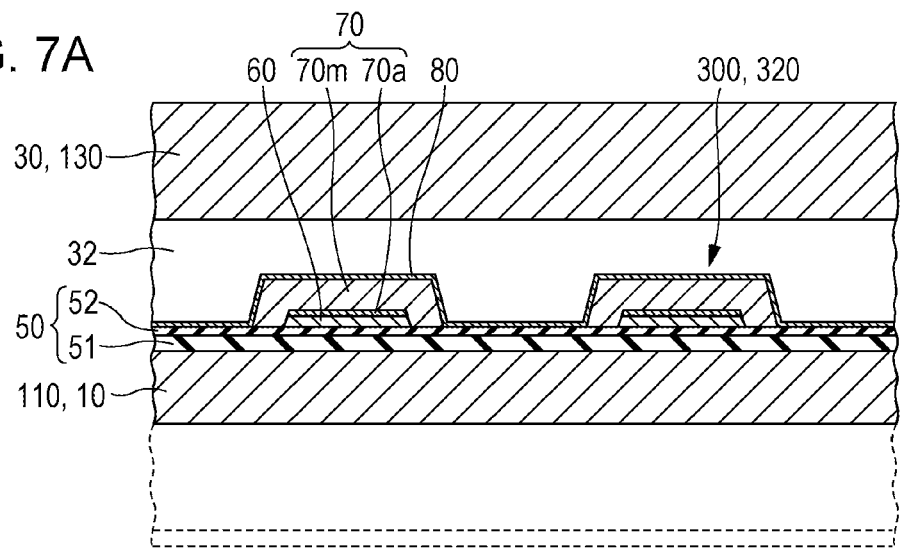
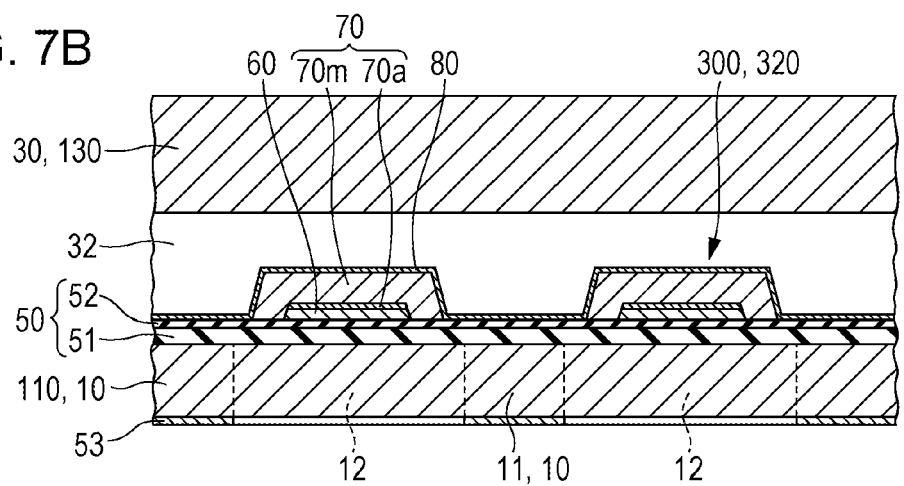
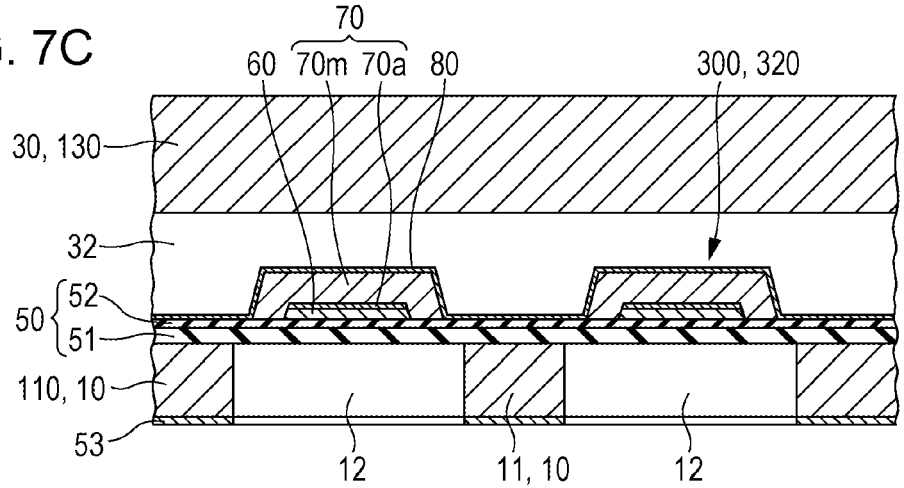

FIG. 8A  NO PRESSURE
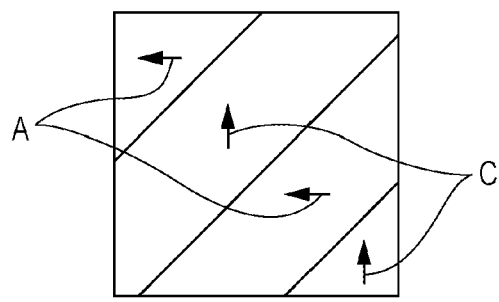
FIG. 8B  PULLING PRESSURE
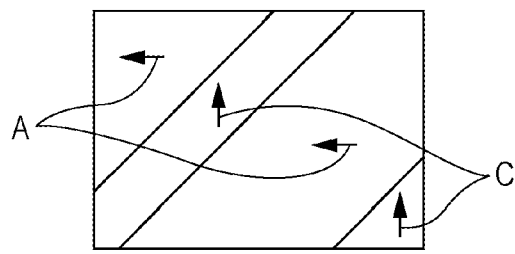
FIG. 8C  PULLING PRESSURE
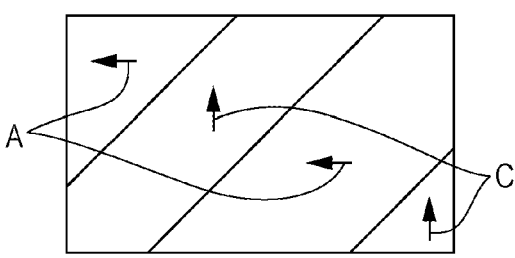

FIG. 18A    SAME PHASE MODE
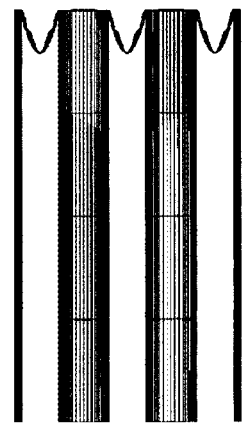
FIG. 18B    REVERSE PHASE MODE
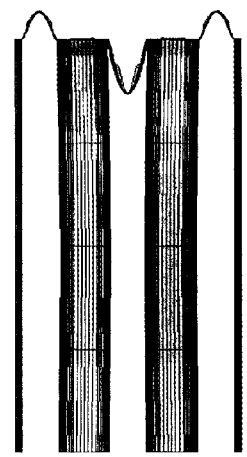

PIEZOELECTRIC ELEMENT, PIEZOELECTRIC ACTUATOR DEVICE, LIQUID EJECTING HEAD, LIQUID EJECTING APPARATUS, AND ULTRASONIC WAVE MEASUREMENT APPARATUS

CROSS-REFERENCE TO RELATED APPLICATIONS

This application is a U.S. National Phase Application under 35 U.S.C. 371 of International Application No. PCT/JP2015/001518, filed on Mar. 18, 2015 and published in English as WO2015/141223 A2 on Sep. 24, 2015. This application claims priority to Japanese Patent Application No. 2014-055580, filed on Mar. 18, 2014 and Japanese Patent Application No. 2014-255509, filed on Dec. 17, 2014. The entire disclosures of the above applications are incorporated herein by reference.

TECHNICAL FIELD

The present invention relates to a piezoelectric element, a piezoelectric actuator device, a liquid ejecting head, a liquid ejecting apparatus, and an ultrasonic wave measurement apparatus.

BACKGROUND ART

In the related art, as a piezoelectric element, an element in which a piezoelectric body layer, which is formed from a piezoelectric material, is interposed between two electrodes is general, and piezoelectric elements are widely used as ultrasonic wave transmission elements and ultrasonic wave reception elements in ultrasonic wave measurement apparatuses, and bending vibration mode actuator devices in liquid ejecting heads. It is possible to include lead zirconate titanate (PZT) as a representative example of a piezoelectric material used in this kind of piezoelectric body layer (refer to JP-A-2001-223404). PZT fundamentally has a rhombohedral crystal structure, and is configured to exhibit a piezoelectric characteristic (an amount of strain) through the induction of an electric dipole moment as a result of the application of an electric field.

Meanwhile, in piezoelectric materials, a piezoelectric material that uses so-called 90 degree domain rotation that differs from the abovementioned theory, is well known. This piezoelectric material, for example, applies an electric field to a crystal, which is tetragonal, and in which an a axis component, a b axis component, and a c axis component are mixed, and is configured to exhibit a piezoelectric characteristic (an amount of distortion) as a result of the a axis component and the b axis component being rotated by 90 degrees at the c axis component.

However, in recent years, there has been a situation in which further increases in density and increases in performance have been desired in liquid ejecting heads, and there is a problem in that even in piezoelectric body layers in which displacement is caused using 90 degree domain rotation or the like, an improvement is desired in a piezoelectric constant. Additionally, in terms of achieving an improvement in a piezoelectric characteristic by improving a piezoelectric constant, since a circumstance in which displacement is hindered by the piezoelectric body layer itself is suppressed when the rigidity of the piezoelectric body layer is low, it is advantageous if the Young's modulus of the entire piezoelectric body layer can be reduced. These matters are also present in the same manner in piezoelectric elements that are used in applications other than liquid ejecting heads.

Accordingly, it is an object of the present invention to provide a piezoelectric element, a piezoelectric actuator device, a liquid ejecting head, a liquid ejecting apparatus, and an ultrasonic wave measurement apparatus that can improve a piezoelectric constant of the piezoelectric body layer.

SUMMARY

According to an aspect of the invention, there is provided a piezoelectric element. The piezoelectric element comprises a substrate; a first electrode provided on the substrate; a piezoelectric body layer provided on the first electrode and comprised of a crystal of a composite oxide having a perovskite structure including Pb, Nb and Ti; and a second electrode provided on the piezoelectric body layer. The crystal has a tetragonal structure and is oriented to the substrate.

A region having a plane and a region having a plane that are perpendicular with respect to a direction of lamination of the first electrode, the piezoelectric body and the second electrode, are mixed inside a lattice of the crystal.

According to the aspect, it is possible to improve a piezoelectric constant of a piezoelectric body layer in which displacement is caused using 90 degree domain rotation, and therefore, a piezoelectric element with an excellent piezoelectric characteristic can be obtained.

In this case, it is preferable that the composite oxide that configures a layer of at least a portion of the piezoelectric body layer is represented by general formula (1) below,

$$xPb(Mg,Nb)O_3\text{-}(1-x)PbTiO_3 \qquad (1)$$

wherein x is more than or equal to 0.20 and less than or equal to 0.60.

As a result of this configuration, it is possible to improve a piezoelectric constant of the piezoelectric element in which displacement is caused using 90 degree domain rotation, and therefore, a piezoelectric element with a superior piezoelectric characteristic can be obtained.

In addition, it is preferable that a crystallite diameter $D_{(002)}$ of the crystal is less than or equal to 15 nm. As a result of this configuration, since the size of the crystal is smaller, and therefore, it is possible for 90 degree domain rotation to occur efficiently, it is possible to improve a piezoelectric constant of the piezoelectric body layer, and therefore, a piezoelectric element with a still superior piezoelectric characteristic can be obtained.

In addition, it is preferable that a ratio $(D_{(200)}/D_{(002)})$ of a crystallite diameter $D_{(200)}$ and a crystallite diameter $D_{(002)}$ in the crystal is greater than 3. As a result of this configuration, since it is possible for 90 degree domain rotation to occur efficiently by an amount by which the crystallite diameter $D_{(002)}$ is smaller than the crystallite diameter $D_{(200)}$, it is possible to improve a piezoelectric constant of the piezoelectric body layer, and therefore, a piezoelectric element with a still superior piezoelectric characteristic can be obtained.

In addition, it is preferable that the piezoelectric body layer includes a foundation layer formed on the first electrode and a main layer provided on the foundation layer. In this configuration, it is preferable that the foundation layer has a lattice matching performance of less than 1% with a c axis of the composite oxide that configures the main layer, and has a lattice mismatching performance of greater than or equal to 1% with an a axis and a b axis of the composite oxide that configures the main layer. As a result of this configuration, orientation control of the piezoelectric material that forms the main layer is made easier, and in addition, since it is possible to stabilize a c axis component of the piezoelectric material, which is tetragonal, it is possible to improve a piezoelectric constant of the piezoelectric body layer, and therefore, a piezoelectric element with a still superior piezoelectric characteristic can be obtained.

In addition, it is preferable that a dielectric constant of the main layer is smaller than a dielectric constant of the foundation layer. As a result of this configuration, since it is possible for 90 degree domain rotation to occur at a low voltage due to the fact that a voltage is efficiently applied to the main layer, it is possible to improve a piezoelectric constant of the piezoelectric body layer, and therefore, a piezoelectric element with a still superior piezoelectric characteristic can be obtained.

In addition, it is preferable that a ratio (c/a) of the c axis and the a axis of the composite oxide that configures the main layer is 1.026 to 1.015. As a result of this configuration, since it is possible for 90 degree domain rotation to occur efficiently, it is possible to improve a piezoelectric constant of the piezoelectric body layer, and therefore, a piezoelectric element with a still superior piezoelectric characteristic can be obtained.

In addition, it is preferable that the foundation layer is comprised of PZT. As a result of this configuration, orientation control of the piezoelectric material that forms the main layer is made easier, and therefore, a piezoelectric element with a still superior piezoelectric characteristic can be obtained.

According to another aspect of the invention, there is provided a piezoelectric element comprising: a substrate; a first electrode provided on the substrate; a piezoelectric body layer provided on the first electrode and comprised of a crystal of a composite oxide having a perovskite structure including Pb, Nb and Ti; and a second electrode provided on the piezoelectric body layer. In the piezoelectric element, the piezoelectric body layer includes a foundation layer formed on the first electrode and a main layer provided on the foundation layer, and a Young's modulus of the entire piezoelectric body layer in a short mode is less than 25% of a Young's modulus of the foundation layer in a short mode. According to the aspect, since the rigidity of the entire piezoelectric body layer is set to be low, a piezoelectric element that is capable of achieving an improvement in a piezoelectric characteristic due to an improvement in a piezoelectric constant, can be obtained.

In this case, it is preferable that a Young's modulus of the entire piezoelectric body layer in a short mode is less than or equal to 50% of a Young's modulus of the entire piezoelectric body layer in an open mode. Since the contribution of a piezoelectric effect is larger, and therefore, it can be said that the piezoelectric body layer has superior electrical-mechanical conversion performance of an amount by which the Young's modulus in a short mode is smaller than the Young's modulus in an open mode is, a piezoelectric element that is capable of further achieving an improvement in a piezoelectric characteristic can be obtained.

In addition, it is preferable that the crystal has a tetragonal structure and is oriented to the substrate.

A region having a plane and a region having a plane that are perpendicular with respect to a direction of lamination of the first electrode, the piezoelectric body and the second electrode, are mixed inside a lattice of the crystal. As a result of this configuration, since, in addition to setting the rigidity of the entire piezoelectric body layer to be low, it is also possible to obtain an improvement in the piezoelectric constant for a layer of the piezoelectric body layer in which displacement is caused using 90 degree domain rotation, a piezoelectric element that is capable of further achieving an improvement in a piezoelectric characteristic can be obtained.

In addition, it is preferable that a crystallite diameter $D_{(002)}$ of the crystal is less than or equal to 15 nm. As a result of this configuration, since it is possible for 90 degree domain rotation to occur efficiently by an amount by which the crystal is smaller, a piezoelectric element that is capable of further achieving an improvement in a piezoelectric characteristic can be obtained.

In addition, it is preferable that a ratio $(D_{(200)}/D_{(002)})$ of a crystallite diameter $D_{(200)}$ and a crystallite diameter $D_{(002)}$ in the crystal is greater than 3. As a result of this configuration, since it is possible for 90 degree domain rotation to occur efficiently by an amount by which the crystallite diameter $D_{(002)}$ is smaller than the crystallite diameter $D_{(200)}$, a piezoelectric element that is capable of further achieving an improvement in a piezoelectric characteristic can be obtained.

In addition, it is preferable that the foundation layer has a lattice matching performance of less than 1% with a c axis of the composite oxide that configures the main layer, and has a lattice mismatching performance of greater than or equal to 1% with an a axis and a b axis of the composite oxide that configures the main layer. As a result of this configuration, orientation control of the piezoelectric material that forms the main layer is made easier, and in addition, since it is possible to stabilize a c axis component of the piezoelectric material, which is tetragonal, a piezoelectric constant of the piezoelectric body layer is improved, and therefore, a piezoelectric element that is capable of further achieving an improvement in a piezoelectric characteristic can be obtained.

In addition, it is preferable that a dielectric constant of the main layer is smaller than a dielectric constant of the foundation layer. As a result of this configuration, since a voltage is efficiently applied to the main layer, it is possible for 90 degree domain rotation to occur at a low voltage.

In addition, it is preferable that a ratio (c/a) of the c axis and the a axis of the composite oxide that configures the main layer is 1.026 to 1.015. As a result of this configuration, since it is possible for 90 degree domain rotation to occur efficiently, a piezoelectric element that is capable of further achieving an improvement in a piezoelectric characteristic can be obtained.

In addition, it is preferable that the composite oxide that configures the main layer is represented by general formula (1) below,

$$xPb(Mg,Nb)O_3\text{-}(1-x)PbTiO_3 \qquad (1)$$

wherein x is more than or equal to 0.20 and less than or equal to 0.60.

As a result of this configuration, it is possible to improve a piezoelectric constant of the piezoelectric element in which displacement is caused using 90 degree domain rotation, and therefore, a piezoelectric element that is capable of further achieving an improvement in a piezoelectric characteristic can be obtained.

In addition, it is preferable that the foundation layer is comprised of PZT. As a result of this configuration, orientation control of the piezoelectric material that forms the main layer is made easier, and therefore, a piezoelectric element that is capable of further achieving an improvement in a piezoelectric characteristic can be obtained.

According to still another aspect of the invention, there is provided an actuator device including any one of the abovementioned piezoelectric elements. According to the aspect, it is possible to improve a piezoelectric constant of a piezoelectric body layer, and therefore, an actuator device including a piezoelectric element with an excellent piezoelectric characteristic can be obtained.

According to still another aspect of the invention, there is provided a liquid ejecting head including the abovementioned actuator device. According to the aspect, it is possible to improve a piezoelectric constant of a piezoelectric body layer, and therefore, a liquid ejecting head including a piezoelectric element with an excellent piezoelectric characteristic can be obtained.

According to still another aspect of the invention, there is provided a liquid ejecting apparatus including the abovementioned liquid ejecting head. According to the aspect, it is possible to improve a piezoelectric constant of a piezoelectric body layer, and therefore, a liquid ejecting apparatus including a piezoelectric element with an excellent piezoelectric characteristic can be obtained.

According to still another aspect of the invention, there is provided an ultrasonic wave measurement apparatus including any one of the abovementioned piezoelectric elements. According to the aspect, it is possible to improve a piezoelectric constant of a piezoelectric body layer, and therefore, an ultrasonic wave measurement apparatus including a piezoelectric element with an excellent piezoelectric characteristic, and excellent ultrasonic wave transmission characteristics and ultrasonic wave reception characteristics, can be obtained.

BRIEF DESCRIPTION OF DRAWINGS

FIG. 7A is a view that shows a production example of the piezoelectric element and the recording head according to Embodiment 1.

FIG. 7B is a view that shows a production example of the piezoelectric element and the recording head according to Embodiment 1.

FIG. 7C is a view that shows a production example of the piezoelectric element and the recording head according to Embodiment 1.

FIG. 8A is a view that describes a domain structure in an ideal state.

FIG. 8B is a view that describes a domain structure before a Wake-up process.

FIG. 8C is a view that describes a domain structure after a Wake-up process.

FIG. 18A is a view that shows a result of a vibration mode calculation using an actuator design value.

FIG. 18B is a view that shows a result of a vibration mode calculation using an actuator design value.

DETAILED DESCRIPTION

Hereinafter, embodiments of the present invention will be described with reference to the drawings. However, the following explanation shows an aspect of the present invention, and it is possible to make changes in an arbitrary manner within the scope of the present invention. Components that have been given the same symbol in each drawing show the same member, and descriptions thereof have been omitted as appropriate.

Embodiment 1

Figure 1:
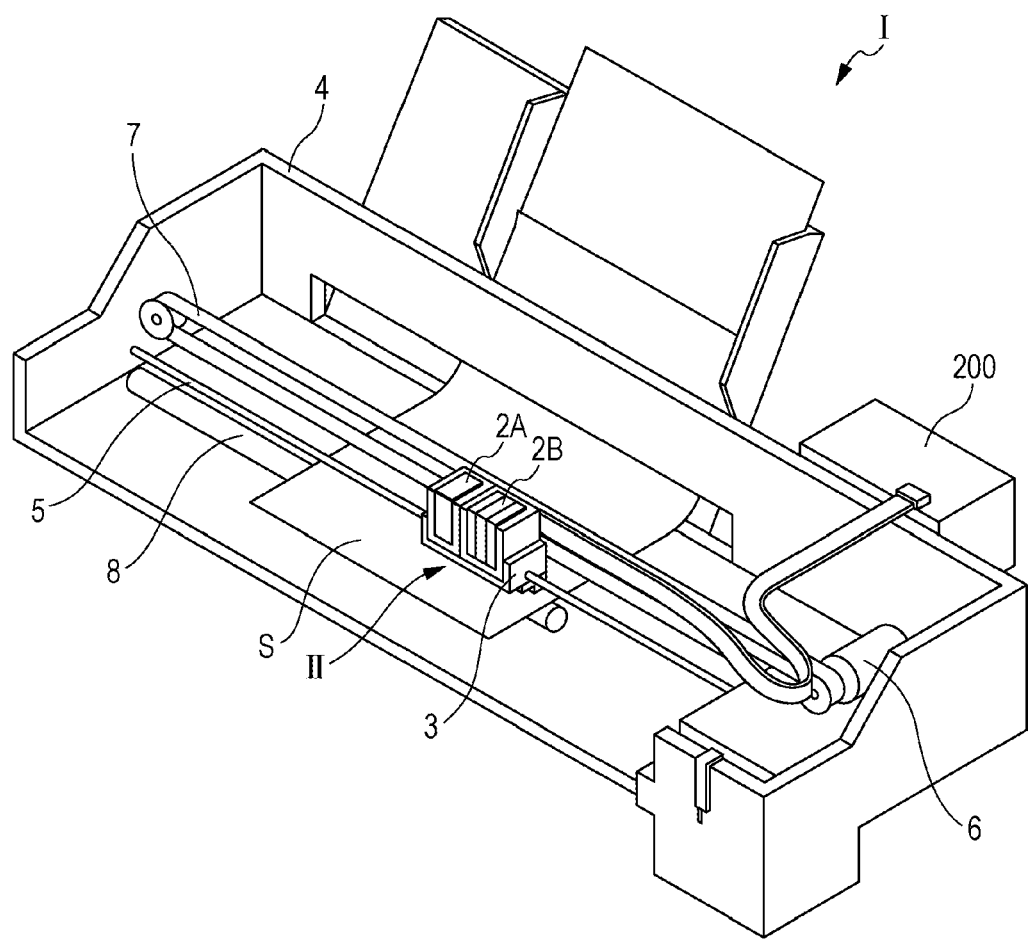
FIG. 1 is a view that shows a schematic configuration of a recording apparatus according to Embodiment 1.

FIG. 1 is an ink jet type recording apparatus, which is an example of a liquid ejecting apparatus according to Embodiment 1 of the present invention.

As illustrated in the drawing, in an ink jet type recording apparatus I, cartridges 2A and 2B, which configure an ink supply means are provided in a detachable manner in an ink jet type recording head unit (head unit) II that has a plurality of ink jet type recording heads. A carriage 3, in which the head unit II is installed, is provided on a carriage shaft 5, which is attached to an apparatus main body 4, in a manner in which the carriage 3 is movable in an axial direction, and for example, is set to respectively discharge a black ink composition and a color ink composition.

Further, a driving force of a driving motor 6 is transmitted to the carriage 3 via a plurality of gear wheels that are not shown in the drawings and a timing belt 7, and the carriage 3, in which the head unit II is installed, is moved along the carriage shaft 5. Meanwhile, a transport roller 8 is provided in the apparatus main body 4 as transport means, and recording sheets S, which are a recording medium such as a paper, are transported by the transport roller 8. Additionally, the transport means that transports the recording sheets S may be is not limited to a transport roller, and may be a belt, a drum or the like.

Figure 2:
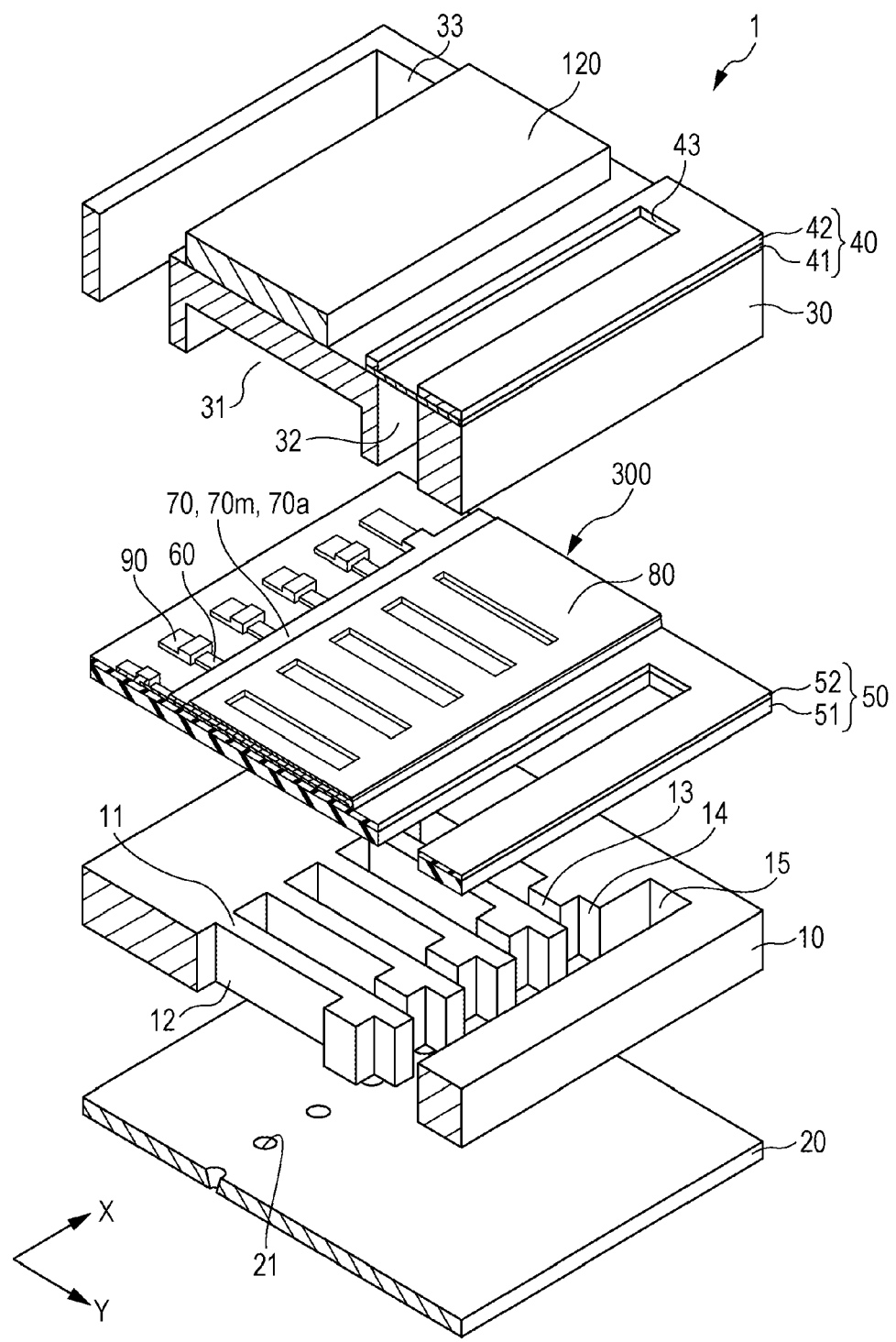
FIG. 2 is an exploded perspective view that shows a recording head according to Embodiment 1.
Figure 3A:
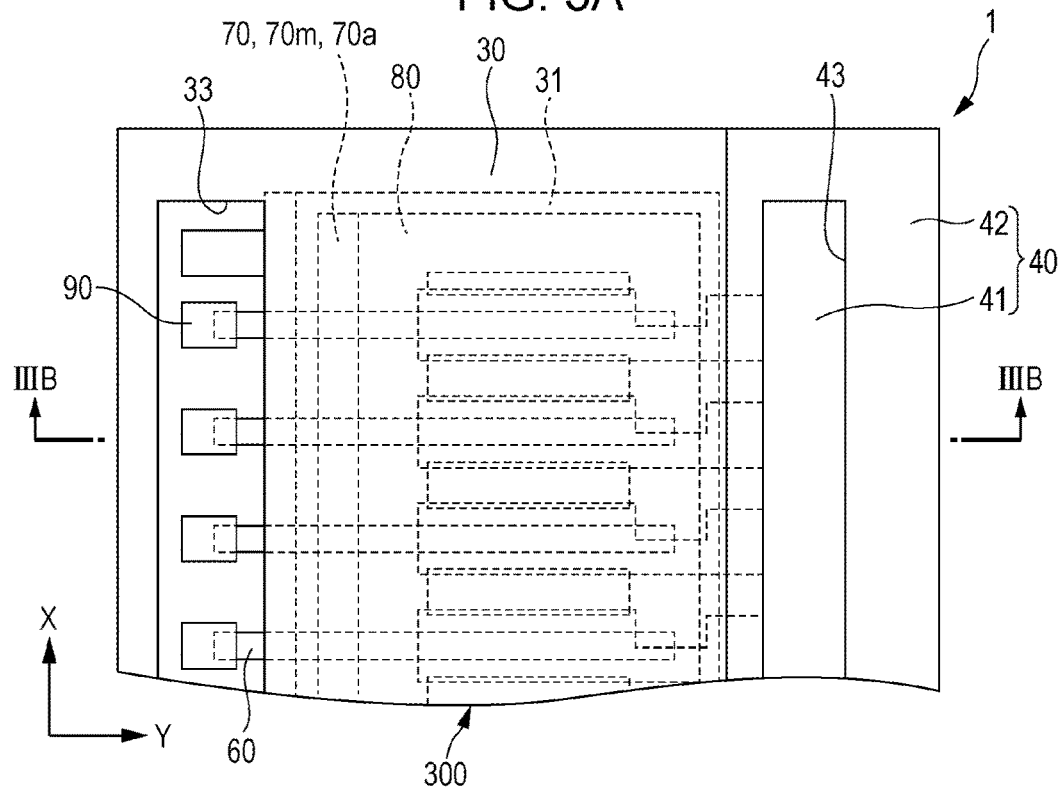
FIG. 3A is a plan view that shows the recording head according to Embodiment 1.
Figure 3B:
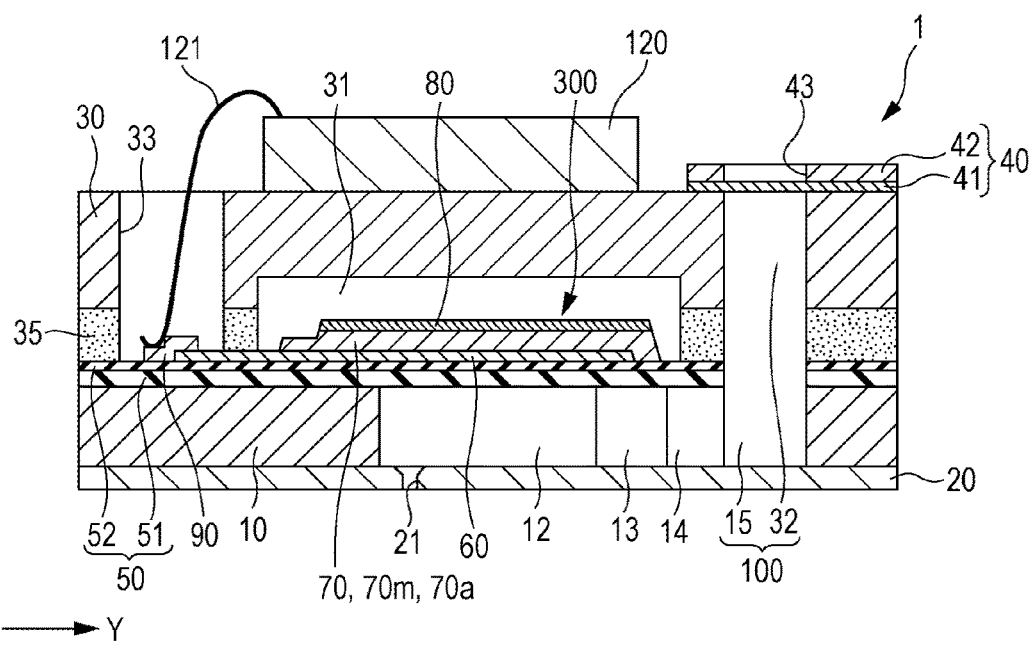
FIG. 3B is a cross-sectional view that shows the recording head according to Embodiment 1.

Next, an example of an ink jet type recording head 1 installed in this kind of ink jet type recording apparatus I will be described with reference to FIGS. 2 to 3B. FIG. 2 is an exploded perspective view of an ink jet type recording head, which is an example of a liquid ejecting head according to the present embodiment. In addition, FIG. 3A is a plan view of a piezoelectric element side of a flow channel formation substrate, and FIG. 3B is a cross-sectional view that corresponds to a line IIIB-IIIB in FIG. 3A.

As illustrated in the drawing, pressure generation chambers 12 are formed in a flow channel formation substrate 10. Further, the pressure generation chambers 12, which are partitioned by a plurality of dividing walls 11, are arranged in parallel along a direction in which a plurality of nozzle openings 21, which discharge ink of the same color, are arranged in parallel. Hereinafter, this direction will be referred to as an arrangement direction of the pressure generation chambers 12, or as a first direction X, and a direction orthogonal to the first direction X will be referred to as a second direction Y.

Ink supply channels 13 that reduce an opening area by constricting a side of the pressure generation chamber 12 from the first direction X, and communication channels 14 that have substantially the same width in the first direction X as the pressure generation chambers 12, are partitioned at an end part side in the second direction Y of the pressure generation chambers 12 of the flow channel formation substrate 10 by the plurality of dividing walls 11. A communication portion 15, which configures a portion of a manifold 100, which is a common ink chamber of each pressure generation chamber 12, is formed on an outer side of the communication channels 14 (a side opposite to the pressure generation chambers 12 in the second direction Y). That is, a liquid flow channel including the pressure generation chambers 12, the ink supply channels 13, the communication channels 14, and the communication portion 15 is formed in the flow channel formation substrate 10.

A nozzle plate 20, through which the nozzle openings 21, which are in communication with each pressure generation chamber 12, penetrate, is joined to a first surface side of the flow channel formation substrate 10, that is, a surface at which the liquid flow channel of the pressure generation chambers 12 and the like is open, using an adhesive, a heat welding film or the like. The nozzle openings 21 are arranged in parallel on the nozzle plate 20 in the first direction X.

A vibration plate 50 is formed on a second surface side that faces the first surface side of the flow channel formation substrate 10. The vibration plate 50 may be comprised of an elastic film 51 provided on the flow channel formation substrate 10, and an insulating body film 52 provided on the elastic film 51. However, the vibration plate 50 is not limited to the abovementioned configuration, and an elastic film may be comprised of a portion of the flow channel formation substrate 10 with thinning treatment.

A piezoelectric element 300, which is configured by a first electrode 60, a piezoelectric body layer 70 and a second electrode 80 using a cohesion layer comprised of titanium, for example, is formed on the insulating body film 52. However, it is possible to omit the cohesion layer.

At least a portion of the layers of the piezoelectric body layer 70 is configured by a main layer 70m that mainly contributes to a displacement characteristic when voltage is applied thereto, and in particular, as will be described in detail later, the piezoelectric body layer 70 of the present embodiment comprised of a foundation layer 70a formed on a first electrode 60 and the main layer 70m provided on the foundation layer 70a. However, the foundation layer 70a can be omitted, and it is also possible for the entire piezoelectric body layer 70 to be configured so as to form the main layer 70m.

In the present embodiment, the piezoelectric element 300 and the vibration plate 50, in which displacement is caused as a result of driving of the piezoelectric element 300, are referred to collectively as an actuator device (an actuator). In addition, the vibration plate 50 and the first electrode 60 act as a vibration plate, but the configuration is not limited to this. A configuration in which either one of or both of the elastic film 51 and the insulating body film 52 are not provided, and the first electrode 60 only acts as a vibration plate is also possible. In addition, a configuration in which the piezoelectric element 300 itself also effectively includes a function of a vibration plate is also possible. In a case in which the first electrode 60 is directly provided on the flow channel formation substrate 10, it is preferable to protect the first electrode 60 with an insulating protective film or the like so that there is no conduction between the first electrode 60 and ink.

In this kind of piezoelectric element 300, generally, either one of the electrodes is set as a common electrode, and the other electrode is set as an individual electrode through patterning for each pressure generation chamber 12. In the present embodiment, the first electrode 60 is set as an individual electrode and the second electrode 80 is set as a common electrode, but this configuration may be reversed for the convenience of a driving circuit 120 or connection wiring 121. In the present embodiment, the second electrode 80 is set as the common electrode by being formed continuously across a plurality of pressure generation chambers 12.

The second electrode 80 is provided on a surface side of the piezoelectric body layer 70 opposite to the first electrodes 60. The material of the abovementioned first electrodes 60 and the second electrode 80 is not particularly limited as long as the material is conductive, and the use of a precious metal such as platinum (Pt) or iridium (Ir) is preferable.

A protective substrate 30, which includes a manifold portion 32 that configures at least a portion of a manifold 100 is joined to the flow channel formation substrate 10 on which the piezoelectric element 300 is formed, that is, to the vibration plate 50, the first electrodes 60 and lead electrodes 90 using an adhesive 35. In the present embodiment, the manifold portion 32 is formed across the entirety of a width direction of the pressure generation chambers 12 by penetrating the protective substrate 30 in a thickness direction. The manifold 100 is connected with the communication portion 15 of the flow channel formation substrate 10 in the manner mentioned above, and configures an ink chamber that is common to each pressure generation chamber 12. In addition, only the manifold portion 32 may be used as the manifold by dividing the communication portion 15 of the flow channel formation substrate 10 into a plurality of portions for each pressure generation chamber 12. Furthermore, for example, only the pressure generation chambers 12 may be provided in the flow channel formation substrate 10, and the ink supply channels 13, which are in communication with the manifold and each pressure generation chamber 12, may be provided in the elastic film 51 and the insulating body film 52 which are interposed between the flow channel formation substrate 10 and the protective substrate 30.

A piezoelectric element retention portion 31 that includes a space having an enough extent not to disturb the movement of the piezoelectric element 300 is provided in the protective substrate 30 in a region that faces the piezoelectric element 300. Additionally, as long as the piezoelectric element retention portion 31 keeps a space having an enough extent not to disturb the movement of the piezoelectric element 300, the space may be sealed or may not be sealed. The driving circuit 120, which functions as a signal processing unit is fixed onto the protective substrate 30. For example, the driving circuit 120 can use a circuit board, a semiconductor integrated circuit (IC) or the like, and is connected to a printer controller (200 in FIG. 1). The driving circuit 120 and the lead electrode 90 can be electrically connected via connection wiring 121 comprised of conductive wire such as bonding wire inserted through a through hole 33.

In addition, a compliance substrate 40 including a sealing film 41 and a fixing plate 42 is joined to the protective substrate 30. The sealing film 41 is formed from a material with low rigidity, and a surface of the manifold portion 32 is sealed using the sealing film 41. In addition, the fixing plate 42 can be configured using a hard material such as a metal. Since a region of the fixing plate 42 that faces the manifold 100 forms an open portion 43 in which the fixing plate 42 has been completely removed in the thickness direction, a surface of the manifold 100 is sealed by the flexible sealing film 41.

Figure 4:
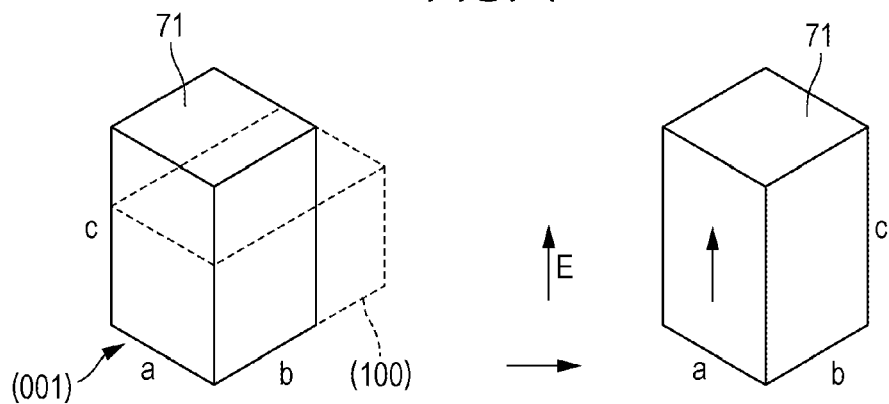
FIG. 4 is a view that describes a piezoelectric element according to Embodiment 1.
Figure 5:
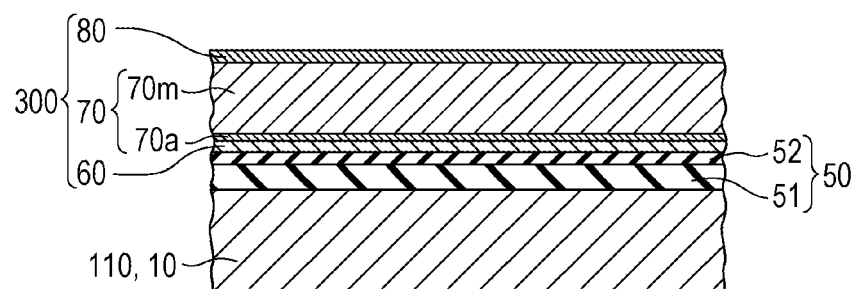
FIG. 5 is a view that describes the piezoelectric element according to Embodiment 1.

A piezoelectric element according to the present embodiment will be described using FIGS. 4 and 5. FIG. 4 is a view that describes so-called 90 degree domain rotation. FIG. 5 is a view that describes an aspect of the present embodiment in which the piezoelectric body layer 70 includes the foundation layer 70a formed on the first electrode 60 and the main layer 70m provided on the foundation layer 70a.

The piezoelectric element 300 is a piezoelectric element in which the first electrode 60, the piezoelectric body layer 70, and the second electrode 80 are sequentially laminated, in which a crystal that configures the piezoelectric body layer 70 has a tetragonal structure, in which the crystal is {100} oriented on the flow channel formation substrate 10, and in which each region, which has a (100) plane and a (001) plane that are perpendicular with respect to a direction of lamination, is mixed inside a lattice of the crystal. Additionally, put another way, the direction of lamination can also be referred to as the thickness direction of the piezoelectric element 300, and corresponds to a direction perpendicular to both the abovementioned first direction X and the second direction Y.

The main layer 70m that configures at least a portion of the layers of the piezoelectric body layer 70 is comprised of a composite oxide. The composite oxide includes a tetragonal ceramic in which Pb ($M'_{1/3}$, $Nb_{2/3}$) $O_3$, which is pseudo cubic, and $PbM''O_3$, which is tetragonal, are solid-dissolved. The composite oxide is represented by general formula (1) below.

In this kind of perovskite type structure, that is, in an $ABO_3$ type structure, an A site is in 12-fold coordination surrounded by a cuboctahedron of oxygen atoms and a B site is in 6-fold coordination surrounded by an octahedron of oxygen atoms. In general formula (2), Pb is positioned at the A site, Nb, M' and M'' are positioned at the B site, a bivalent metal such as Mg, Mn, Fe, Ni, Co, Zn or the like can be used as M', and a tetravalent metal such as Ti, Zr or the like can be used as M''. In this embodiment, Mg is used as M', and Ti is used as M''.

In other words, in the present embodiment, the main layer 70m includes a tetragonal ceramic in which lead magnesium niobate (Pb(Mg, Nb)$O_3$; PMN), and lead titanate (PbTiO$_3$; PT) are solid-dissolved, and is formed from a composite oxide represented by general formula (3) below in which lead is in excess of the stoichiometry of the $ABO_3$ structure. As a result of this, it is possible to achieve a further improvement in the piezoelectric constant.

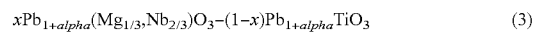

(0.20 is less than or equal to x and less than or equal to 0.60 is preferable, and 0.30 is less than or equal to x and less than or equal to 0.45 is more preferable)

The descriptions in the formula are compositional notations that are based on stoichiometry, and in addition to inevitable deviation in composition due to lattice mismatching, deficiency of a portion of the elements and the like, substitution of a portion of the elements or the like is also allowed within a range in which a perovskite structure can be understood. For example, if a stoichiometric ratio is set as 1, a value within a range of 0.85 to 1.20 is allowed. The metals of M' and M'' are not limited to being single and a plurality thereof may be used.

As shown in FIG. 4, in the main layer 70m, a domain 71 that includes a (100) plane and a (001) plane that are perpendicular with respect to a direction of lamination (the thickness direction of the piezoelectric element 300) is mixed inside a lattice of the crystal, an a axis component and a b axis component of a tetragon rotate 90 degree to a c axis component as a result of the application of an electric field E, and a piezoelectric characteristic is exhibited as a result. In particular, in the present embodiment, a ferroelectric domain 71 (a so-called nanodomain), a crystallite diameter $D_{(002)}$ of a crystal of the piezoelectric material of which is set to less than or equal to 20 nm, and in particular, less than or equal to 15 nm, is formed inside each columnar grain disposed through a fired interface, and which configures a thin film. As a result of this, since it is possible for it 90 degree domain rotation to occur efficiently, it is possible to further improve a piezoelectric constant of the piezoelectric body layer 70.

Incidentally, other than the piezoelectric body layer 70 including a main layer 70m in which displacement is caused using 90 degree domain rotation in this manner, piezoelectric body layers that are not accompanied by 90 degree domain rotation are also well known. However, in such piezoelectric body layers, since displacement does not occur with an angular relationship such as that of 90 degree domain rotation, the two kinds of piezoelectric body layer are fundamentally different.

In addition, other than the main layer 70*m* of the present embodiment, there are many cases in which a piezoelectric body layer (for example, PZT) that exhibits a piezoelectric characteristic through the induction of an electric dipole moment inside a ferroelectric domain is set to realize a predetermined compositional ratio by using a property in which the piezoelectric constant becomes extremely large in the vicinity of a morphotropic phase boundary at which a crystalline structure changes. Meanwhile, the fact that the main layer 70*m* such as that of the present embodiment that uses 90 degree domain rotation can obtain displacement that also surpasses that of the abovementioned PZT will be confirmed in examples, which will be described later.

Furthermore, as shown in FIG. 5, the piezoelectric body layer 70 of the present embodiment includes the foundation layer 70*a*, which has a lattice matching performance of less than 1% with a c axis of the composite oxide that configures the main layer 70*m* of the piezoelectric body layer 70, and has a lattice mismatching performance of greater than or equal to 1% with an a axis and a b axis of the composite oxide, on the first electrode 60. As a result of this configuration, orientation control of the piezoelectric material is made easier, and in addition, since it is possible to stabilize a c axis component of the piezoelectric material, which is tetragonal, it is possible to further improve a piezoelectric constant of the piezoelectric body layer.

The foundation layer 70*a* may be comprised of a substance having an $ABO_3$ type crystalline structure, the composition of which differs from the composite oxide of the piezoelectric body layer 70 which is tetragonal. The foundation layer 70*a* is comprised of PZT in this embodiment. As a result of using PZT, for example, it is possible to easily realize a structure in which a compound that has a higher dielectric constant than the piezoelectric body layer 70, which has a structure that, for example, is represented by the abovementioned general formula (2), is in contact with the piezoelectric body layer 70, and therefore, it becomes easier to achieve further improvements in the piezoelectric body layer.

A lattice mismatching rate of the c axis component of the composite oxide that configures the main layer 70*m* of the piezoelectric body layer 70, which is tetragonal, and PZT can preferably be set to less than or equal to 0.1%, and a lattice mismatching rate of the a axis component and the b axis component of the composite oxide and PZT can preferably be set to greater than or equal to 1.5%. As a result of this, it is possible to further improve the piezoelectric body layer.

The thickness of the foundation layer 70*a* can be determined as appropriate in consideration of thicknesses that are required in the piezoelectric body layer 70 and the main layer 70*m*. In FIG. 5, the foundation layer 70*a* is formed between the main layer 70*m* and the first electrode 60, but as long as a configuration in which the foundation layer 70*a* is present on the first electrode 60 side of the main layer 70*m*, the position of the foundation layer 70*a* is not limited to the abovementioned example, and the number of foundation layers is not limited either. For example, the main layer 70*m* and the foundation layer 70*a* may be alternately laminated. Such the configuration enables to increase a contact area of the main layer 70*m* and the foundation layer 70*a*.

Next, an example of a production method of the piezoelectric element will be described in combination with an example of a production method of an ink jet type recording head in which the piezoelectric element is installed with reference to FIGS. 6A to 7C.

Firstly, the vibration plate 50 is formed on the surface of a flow path forming substrate wafer 110, which is a silicon wafer. In the present embodiment, a vibration plate 50 includes a lamination of a silicon dioxide (the elastic film 51) and zirconium oxide (the insulating body film 52) which is formed through thermal oxidation after forming a zirconium film using a sputtering method. The elastic film 51 is formed through thermal oxidation of the flow path forming substrate wafer 110. The insulating body film 52 is formed by thermal oxidation of the sputtered zirconium film. In the present embodiment, a cohesion layer (not shown in the drawings) is further formed on the vibration plate 50, but it is possible to omit the cohesion layer.

Figure 6A:
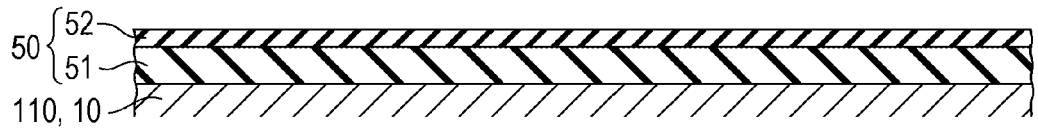
FIG. 6A is a view that shows a production example of the piezoelectric element and the recording head according to Embodiment 1.

Next, as shown in FIG. 6A, the first electrode 60 is formed over the entire surface of the cohesion layer on the vibration plate 50. For example, the first electrode 60 may be formed by a sputtering method or a PVD method (a physical vapor deposition method), gas phase film formation such as a laser ablation method, liquid phase film formation such as a spin coating method or the like. Next, the foundation layer 70*a* is formed on the first electrode 60. The formation method of the foundation layer 70*a* is not limited. The foundation layer 70*a* may be formed by a liquid phase method or a solid phase method. For example, the foundation layer may be formed by a chemical solution method such as an MOD (Metal-Organic Decomposition) method or a sol-gel method, that obtains a foundation layer of a metal oxide by coating and drying a solution including metal complexes and firing the solution at a high temperature. In addition, the foundation layer 70*a* may be formed by another method such as a laser ablation method, a sputtering method, a pulse-laser-deposition method (a PLD method), a CVD method, or an aerosol-deposition method. Additionally, it is possible to omit the foundation layer 70*a* according to necessity.

Figure 6B:
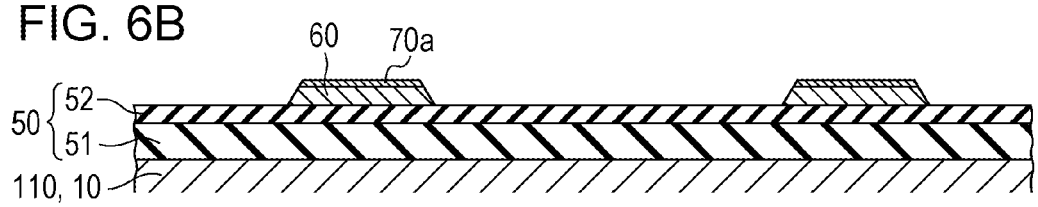
FIG. 6B is a view that shows a production example of the piezoelectric element and the recording head according to Embodiment 1.

Next, as shown in FIG. 6B, the first electrode 60 is simultaneously patterned with the foundation layer 70*a* (a first electrode patterning process). This patterning may be performed by reactive ion etching (RIE), dry etching such as ion milling or the like. Additionally, the foundation layer 70*a* may be formed after patterning the first electrode 60, or the foundation layer 70*a* may be omitted. In addition, patterning of the first electrode 60 and the foundation layer 70*a* may be performed simultaneously with the main layer 70*m* described later.

Next, the main layer 70*m* is laminated on the foundation layer 70*a*. The formation method of the main layer 70*m* is not limited. The main layer 70*m* may be formed by a liquid phase method or a solid phase method. For example, the main layer 70*m* may be formed by a chemical solution method such as an MOD method or a sol-gel method, that obtains a main layer (a piezoelectric body film) 70*m* of a metal oxide by coating and drying a solution including metal complexes and firing the solution at a high temperature. In addition, the main layer 70*m* may be formed by another method such as a laser ablation method, a sputtering method, a PLD method, a CVD method, or an aerosol-deposition method.

Figure 6C:
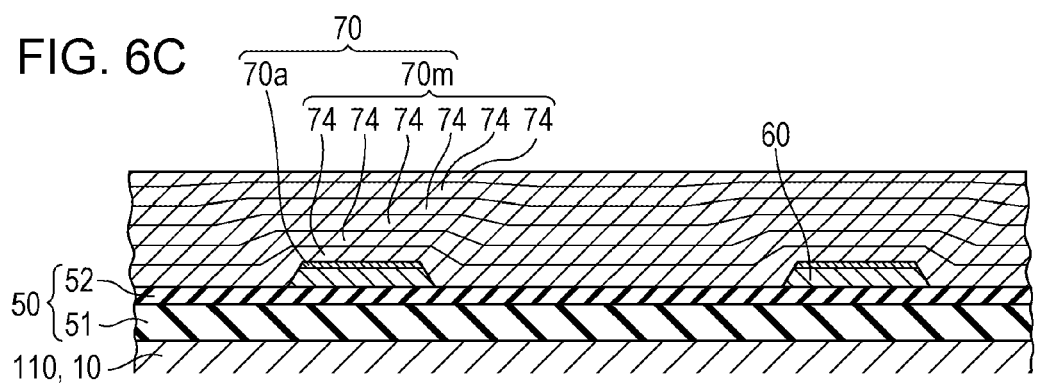
FIG. 6C is a view that shows a production example of the piezoelectric element and the recording head according to Embodiment 1.

A specific example of the sequence for forming the main layer 70*m* using a chemical solution method is as follows. First, a precursor solution that includes metal complexes is prepared. Next, a precursor film 74 is formed by coating the precursor solution onto the first electrode 60 using a spin coating method or the like (a coating process). Further, the precursor film is heated to a predetermined temperature and is dried for a fixed time (a drying process), and the dried precursor film is degreased by further heating to a predetermined temperature and retaining for a fixed time (a degreasing process). Finally, the precursor film is crystallized by heating to a predetermined temperature and retaining the predetermined temperature at a fixed time (firing process), then the main layer 70*m* is obtained as shown in FIG. 6C.

The solution used in the coating process may be prepared by mixing metal complexes that are capable of forming a composite oxide precursor film that includes Pb, Mg, Nb and Ti by firing, and dissolving or dispersing the mixed metal complexes in an organic solvent. Lead acetate or the like may be used for the metal complex that includes Pb, for example. Magnesium acetate or the like may be used for the metal complex that includes Mg, for example. Niobium penta-n-butoxide or the like may be used for the metal complex that includes Nb, for example. Titanium tetra-i-propoxide or the like may be used for the metal complex that includes Ti for example.

Figure 6D:
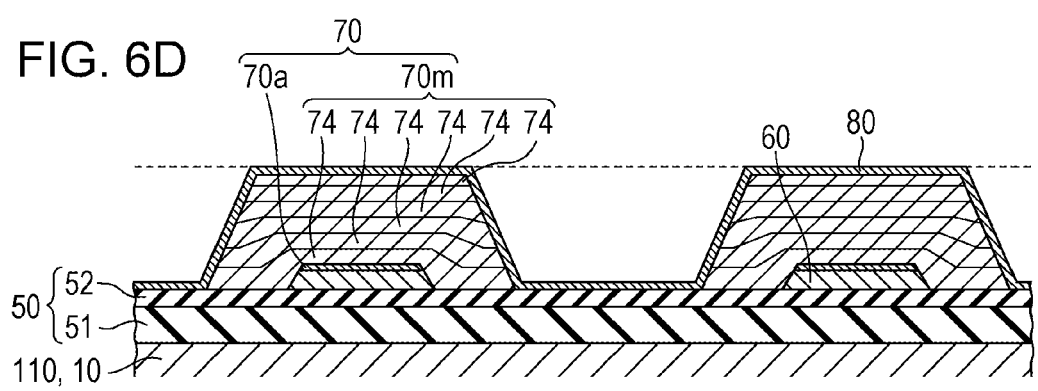
FIG. 6D is a view that shows a production example of the piezoelectric element and the recording head according to Embodiment 1.

After the main layer 70*m* is formed, as shown in FIG. 6D, the second electrode 80, which is formed from platinum or the like, is formed on the main layer 70*m*. The second electrode 80 may be formed following sequence. A platinum layer is formed on the main layer 70*m* using a sputtering method or the like, the piezoelectric body layer 70 and the platinum layer are simultaneously patterned in a region that faces each pressure generation chamber 12, and further platinum film is formed on the preceding platinum layer according to necessity. Thereby, the piezoelectric element 300 including the first electrode 60, the piezoelectric body layer 70, and the second electrode 80, is completed.

Thereafter, as shown in FIG. 7A, a protective substrate wafer 130, which is a silicon wafer and serves as a plurality of protective substrates 30, is bonded to the surface on which a piezoelectric element 300 is provided of the flow path forming substrate wafer 110, and the flow path forming substrate wafer 110 is thinned to a predetermined thickness. Further, as shown in FIG. 7B, a mask film 53 is newly formed on the flow path forming substrate wafer 110 and is pattered to a predetermined shape. As shown in FIG. 7C, the pressure generation chambers 12 that correspond to the piezoelectric element 300 are formed by anisotropic etching (wet etching) of the flow path forming substrate wafer 110 using an alkali solution such as a KOH via the mask film 53.

Subsequently, in accordance with ordinary methods, unnecessary portions of the outer peripheral edge portions of the flow path forming substrate wafer 110 and the protective substrate wafer 130 are removed by cutting using dicing or the like, for example. Further, the mask film 53 on a surface of a side of the flow path forming substrate wafer 110 opposite to the protective substrate wafer 130 is removed, the nozzle plate in which the nozzle openings are drilled is bonded to the surface, and the compliance substrate is bonded to the protective substrate wafer 130. Finally, the flow path forming substrate wafer 110 etcetera are divided into a plurality of flow channel formation substrate 10 having a single chip size such as that shown in FIG. 2 thereby the recording head is obtained.

An example of a production method of the piezoelectric element of the present embodiment has been described above in combination with an example of a production method of an ink jet type recording head. An electric field formed from a bipolar oscillatory waveform may be applied between the first electrode 60 and the second electrode 80 (a Wake-up process), after the production of the piezoelectric element 300. The electric field may be greater than or equal to 40 V, and preferably greater than or equal to 45 V. The oscillatory waveform may be a triangular waveform. Such process enables to improve a ratio of (001) oriented components in the piezoelectric material. The larger effect can be obtained with the larger content ratio of lead titanate.

Generally, in piezoelectric bodies with tetragonal structures, in order to relieve inner stress caused by a c axis-a axis length ratio (c/a), a 90 degree domain such as that shown in FIG. 8A is formed. At this time, in an ideal state in which the effects of external fields are not received, an existence probability of a C domain shown by a C symbol in the drawing (a domain polarized in a direction perpendicular to the surface), and an A domain shown by an A symbol in the drawing (a domain polarized in a direction within the surface), is 1:1.

Meanwhile, in the piezoelectric body layer 70, in particular, the main layer 70*m* is formed by a coating method that coats the precursor solution. Therefore, a pulling stress is applied to the precursor film. The pulling stress are occurred from a volume contraction of the precursor film that accompanies the disassembly and desorption of a solvent and ligands from the precursor solution, and from a difference in the thermal expansion coefficients of a substrate and the precursor film. Therefore, the main layer 70*m* is stretched into the surface of the substrate in comparison with a state in which there is no stress. That is, in the present embodiment, there is an external field in which it is easy to form the A domain, and it is not possible to form the original 90 degree domain, and therefore, as shown in FIG. 8B, a given number of domains are present as A domains with high energy that are metastable in terms of internal stress.

Meanwhile, it is thought that domains are rearranged by the Wake-up process, and it becomes easier to maintain a stable state in terms of internal stress. However, since the effects of the pulling stress of external fields are also present after the Wake-up process, it is not possible to establish the ideal 1:1 presence, and therefore, as shown in FIG. 8C, A domains are also present at a high ratio after the Wake-up process. It is possible to confirm this kind of change on the basis of a peak intensity of an X-ray, for example. In addition, since c/a becomes larger, that is, internal stress is increased on a lead titanate side, a presence ratio of C domains becomes larger after the Wake-up process.

Embodiment 2

Hereinafter, Embodiment 2 of the present invention will be described in detail with a focus on portions that differ from the abovementioned Embodiment 1. The piezoelectric element according to a second embodiment of the present invention includes a first electrode 60, a piezoelectric body layer 70 comprised of a composite oxide having a perovskite structure that includes at least Pb, Nb and Ti, and a second electrode 80, that are sequentially laminated on the flow channel formation substrate 10. The piezoelectric body layer 70 includes a foundation layer 70*a* formed on the first electrode 60, and a main layer 70*m* provided on the foundation layer 70*a*. A Young's modulus of the entire piezoelectric body layer 70 in a short mode is less than 25% of a Young's modulus of the foundation layer 70*a* in a short mode.

Embodiment 1 focused on achieving an improvement in the piezoelectric constant of the main layer 70*m* by configuring the main layer 70*m* of the piezoelectric body layer 70 using a predetermined composite oxide, but since a circumstance in which displacement is hindered by the piezoelectric body layer 70 itself is suppressed when the rigidity of the piezoelectric body layer 70 is low, it is advantageous to improvements in the piezoelectric characteristic if the Young's modulus of the entire piezoelectric body layer 70 can be reduced. That is, the present embodiment obtains a piezoelectric element in which the rigidity of the entire piezoelectric body layer is low, and as a result of this, achieves an improvement in a piezoelectric characteristic.

Figure 9:
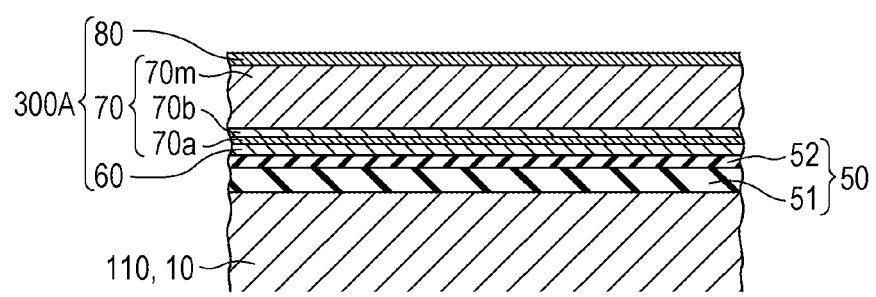
FIG. 9 is a view that shows a modification example of the piezoelectric element according to Embodiment 1.

FIG. 9 is an enlarged cross-sectional view of a piezoelectric element 300A of the present embodiment. In particular, the main layer 70m of the piezoelectric element 300A can be configured from the same composite oxide as Embodiment 1, and in this case, it is also possible to obtain the abovementioned improvement effect in the piezoelectric constant of the main layer 70m that uses 90 degree domain rotation of Embodiment 1, and therefore, it is possible to further achieve an improvement in a piezoelectric characteristic. Without being limited to the main layer 70m, it is also possible for the foundation layer 70a to have the same configuration as that of Embodiment 1, and therefore, by also adopting a preferable aspect of Embodiment 1 in the present embodiment, a superior effect is obtained in the same manner.

In the present embodiment, a foundation layer 70b is further provided on the foundation layer 70a, and the piezoelectric element 300A is configured by laminating the first electrode 60 thereon, but in the same manner as Embodiment 1, in the present embodiment, the number of foundation layers is not limited. In a case in which a plurality of foundation layers 70a and 70b are provided, each layer need not necessarily be in contact with other layers, and another layer within the range of the present invention may be interposed therebetween. For example, in a case in which a crystal seed layer comprised of titanium is provided in order to control on orientation direction of the main layer 70m during film formation, there are many cases in which components of the crystal seed layer are scatted in the processes that follow film formation, and therefore, the crystal seed layer seems to have disappeared, but a layer caused by such components of the crystal seed layer may remain and be interposed between the foundation layers. Furthermore, the main layer 70m and the foundation layers 70a and 70b may be alternately laminated.

Figure 10A:
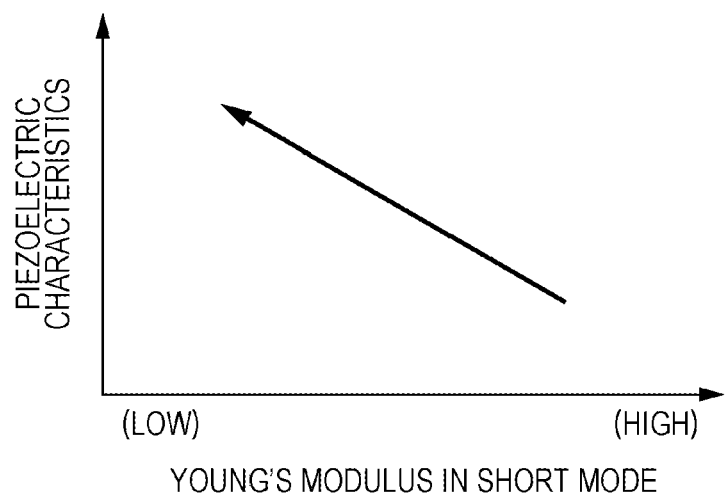
FIG. 10A is a view that describes a relationship between a Young's modulus and a piezoelectric characteristic that are related to the piezoelectric element.
Figure 10B:
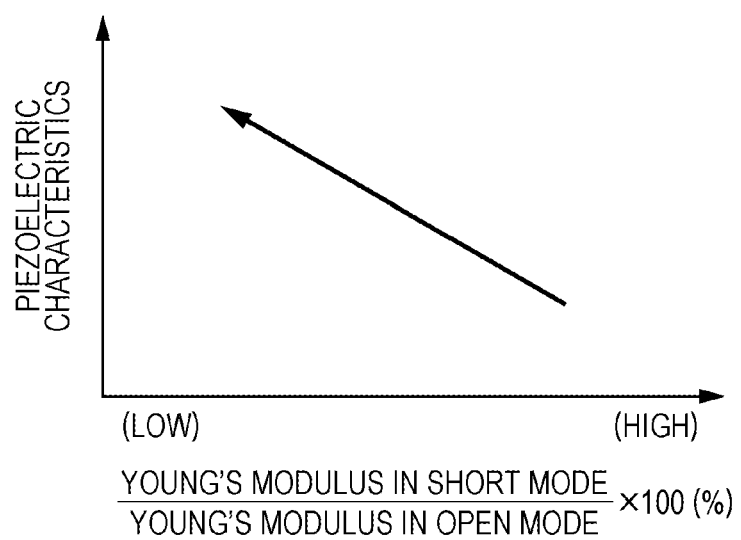
FIG. 10B is a view that describes a relationship between a Young's modulus and a piezoelectric characteristic that are related to the piezoelectric element.

FIG. 10A and FIG. 10B are conceptual drawings that show relationships between a Young's modulus and a piezoelectric characteristic in the present embodiment.

As shown in FIG. 10A, it is advantageous to improvements in a piezoelectric characteristic if the Young's modulus in a short mode is small. The Young's modulus in a short mode is a so-called Young's modulus used as elastic compliance (the inverse of the Young's modulus) in a piezoelectric basic formula (piezoelectric constant d=constant $K_{33}\times$ (dielectric constant epsilon×elastic compliance S)$^{1/2}$). It can also be understood from the piezoelectric basic formula that the elastic compliance becomes greater, the lower the Young's modulus of the entire piezoelectric body layer is, and therefore, that the piezoelectric constant becomes greater.

The Young's modulus in a short mode is a value in which an electrical-mechanical conversion performance of the entire piezoelectric body layer 70 due to a piezoelectric effect is taken into account, that is, a value obtained in a state in which a portion of mechanical energy that results from 90 degree domain rotation occurring due to stress induction, is converted into electrical energy. Furthermore, in other words, the Young's modulus in a short mode is a value obtained in a case in which applied mechanical energy is converted into an elastic waveform of the entire piezoelectric body layer (mechanical energy) and a piezoelectric effect (electrical energy). This kind of Young's modulus in a short mode can, for example, be computed using the shape of a piezoelectric actuator, the Young's modulus of each type of member that configures the piezoelectric actuator, a resonance frequency of the piezoelectric element and the vibration plate and the like.

Each parameter for determining the Young's modulus in a short mode can respectively be acquired using publicly-known methods. For example, a parameter based on the shape of the actuator can be acquired through SEM observation, a parameter based on a resonance frequency can be acquired through observation of amounts of displacement of adjacent segments of the vibration plate. The Young's modulus and each parameter for obtaining the Young's modulus may be determined by calculating whether the value is shows good consistency with values that are measured in practice.

In the abovementioned manner, in the present embodiment, the Young's modulus of the entire piezoelectric body layer 70 in a short mode is less than 25% of a Young's modulus of the foundation layer 70a in a short mode. In this embodiment, the foundation layer 70a is configured from PZT in the same manner as Embodiment 1, and accordingly, in the present embodiment, it is possible to say that the Young's modulus of the entire piezoelectric body layer 70 in a short mode is less than 25% of a Young's modulus of a PZT layer in a short mode. In the related art, a piezoelectric body layer comprised of PZT is well known as a piezoelectric body layer that exhibits an excellent piezoelectric characteristic, but even in comparison with this kind of piezoelectric body layer (PZT layer) of the related art, the piezoelectric body layer 70 of the present embodiment can suppress the Young's modulus in a short mode to less than or equal to a predetermined value, and therefore, is advantageous in a piezoelectric characteristic.

Further, in the piezoelectric element 300A of the present embodiment, a Young's modulus of the entire piezoelectric body layer 70 in a short mode is less than or equal to 50% of a Young's modulus of the entire piezoelectric body layer 70 in an open mode. The Young's modulus in an open mode is different from the abovementioned Young's modulus in a short mode, and is a value in which an electrical-mechanical conversion performance is not taken into account, that is, a value obtained in a state in which mechanical energy is not converted into electrical energy. Furthermore, in other words, the Young's modulus in an open mode is a value of a case in which applied mechanical energy is converted into an elastic waveform of the entire piezoelectric body layer (mechanical energy) only.

As shown in FIG. 10B, it is advantageous to improvements in a piezoelectric characteristic if a ratio (Young's modulus in a short mode/Young's modulus in an open mode) of the Young's modulus in a short mode is small with respect to a Young's modulus of the entire piezoelectric body layer 70 in an open mode. A displacement, which is larger by an amount by which the Young's modulus in a short mode is smaller than the Young's modulus in an open mode, is obtained in a circumstance in which the applied mechanical energy is distributed to a piezoelectric effect (electrical energy). In other words, it can be said to be superior in electrical-mechanical conversion performance by that amount.

The Young's modulus in an open mode can, for example, as shown in the examples, be determined through nano indenter measurement. The Young's modulus in an open mode may also be determined by calculating whether a value is shows good consistency with values that are measured in practice, and can be determined using calculation.

EXAMPLES

Hereinafter, examples will be shown and the present invention will be described more specifically. In addition, the invention is not limited to the examples mentioned below.

Example 1

Preparing of PZT Precursor Solution (Precursor Solution for Foundation Layer 70a)

The precursor solution is prepared by measuring precise amounts of acetic acid, water, lead acetate, zirconium butoxide, titanium tetra-i-propoxide, and polyethylene glycol, putting them into a container, and heating and stirring thereof at 90 degrees Celsius.

Preparing of PMN-PT Precursor Solution (Precursor Solution for Main Layer 70m)

Next, a mixed solution is prepared by measuring precise amounts of 2-butoxyethanol and dimethyl amino ethanol and mixing them in a container. Titanium tetra-i-propoxide and niobium penta-n-butoxide are measured in a glove box filled with dry nitrogen, and added to the mixed solution. Thereafter, the mixed solution thereof is stirred sufficiently. Precise amounts of magnesium acetate and lead acetate are respectively measured and added to the mixed solution in the container at room temperature. The mixed solution is sufficiently stirred at room temperature, then the PMN-PT precursor solution is obtained. The amount of titanium tetra-i-propoxide, niobium penta-n-butoxide, magnesium acetate, and lead acetate are adjusted to obtain a composition represented by general formula (3) having the values x and alpha shown in Table 1.

Manufacturing of Piezoelectric Actuator

A silicon dioxide film is formed on a substrate through thermal oxidation of a 6 inch silicon substrate. Next, a zirconium oxide film (the insulating body film 52) is formed by applying a zirconium film using a sputtering method and thermally oxidizing the zirconium film. The first electrode 60 is formed on the insulating body film 52 by applying in an order of titanium, platinum, iridium and titanium using a sputtering method.

A degreasing film is formed by applying the abovementioned PZT precursor solution using a spin coating and drying and degreasing the applied precursor solution at 140 degrees Celsius and 370 degrees Celsius. A ceramic film (the foundation layer 70a) comprised of PZT is obtained by heating the degreasing film at 737 degrees Celcius using a Rapid Thermal Annealing (RTA) device. A pattern with a predetermined shape is formed on the abovementioned foundation layer 70a by photolithography, and the foundation layer 70a and the first electrode 60 are patterned by dry etching (a first electrode patterning process).

Next, a degreasing film is formed by applying the abovementioned PMN-PT precursor solution onto the foundation layer 70a using a spin coating method, and drying and degreasing the applied precursor solution at 180 degrees Celcius and 350 degrees Celcius. A ceramic film (the precursor film 74) comprised of PMN-PT is obtained by heating the degreasing film at 750 degrees Celcius using RTA. The main layer 70m comprised of six layers of ceramic film (precursor films 74) on the foundation layer 70a is obtained by repeating the above processes six times, thereby the piezoelectric body layer 70 including the foundation layer 70a and the main layer 70m is obtained.

Further, a metal mask is fixed onto the piezoelectric body layer 70, and a platinum film is applied using a sputtering method. Next, the metal mask is removed, and baking the platinum film at 650 degrees Celsius using RTA (an electrode baking process), thereby the second electrode 80 is obtained. Next, a pattern with a predetermined shape is formed by photolithography, and the second electrode 80, the foundation layer 70a and the piezoelectric body layer 70 are patterned by dry etching (a second electrode patterning process). A piezoelectric element 300 in which the first electrode 60, the piezoelectric body layer 70 and the second electrode 80 are sequentially laminated is obtained by the abovementioned processes.

Examples 2 to 6

The piezoelectric elements 300 of Examples 2 to 6 are obtained using the same processes as Example 1 by setting x and alpha in general formula (3) to the ratio shown in Table 1.

Comparative Example 1

The piezoelectric element of Comparative Example 1 is obtained by performing the same process as Example 1 except for the following changes in forming the first electrode. In Comparative Example 1, a silicon dioxide film is formed on a substrate by thermal oxidation of a 6 inch silicon substrate. Next, an aluminum oxide film is formed using an Atomic Layer Chemical Vapor Deposition method (an ALCVD method) on the silicon dioxide film. The first electrode is formed by platinum on the aluminum oxide film using a sputtering method.

Comparative Example 2

In Comparative Example 2, the piezoelectric element having eight layers of PZT is obtained by performing the same process as Example 1 up until forming the first electrode 60, and performing the process for obtaining the ceramic film (the foundation layer 70a) using the PZT precursor solution eight times.

Evaluation Content 1

Scanning Electron Microscopy

The film thicknesses of Examples 1 to 6 and Comparative Examples 1 and 2 are observed using a scanning electron microscope (SEM) on fracture surfaces. All of the examples were columnar crystals, and other than film thickness, no large differences were observed between Examples 1 to 6 and Comparative Examples 1 and 2. The film thicknesses measured by SEM observation are shown in Table 1. Additionally, a film thickness of 130 nm of the foundation layer 70a is included in the numerical values for "film thickness" in Examples 1-6 in Table 1.

P-E Loop Measurement

Figure 11A:
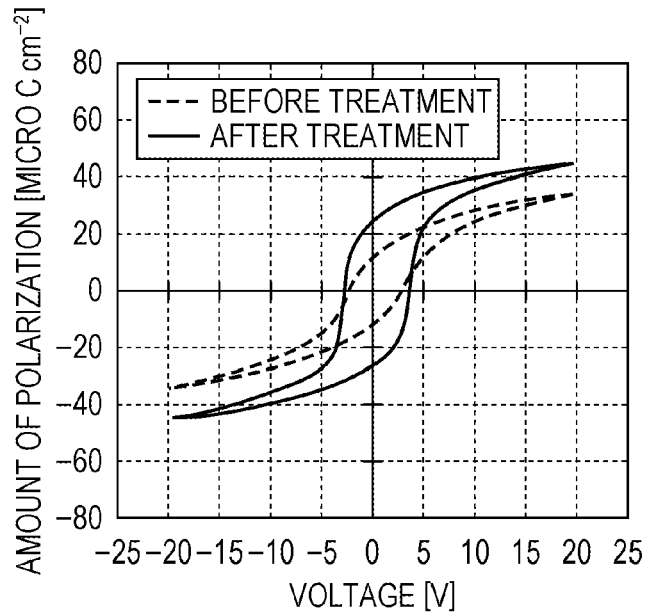
FIG. 11A is a view that describes a relationship between an amount of polarization (P) and a voltage (E) of the piezoelectric element according to an Example.
Figure 11B:
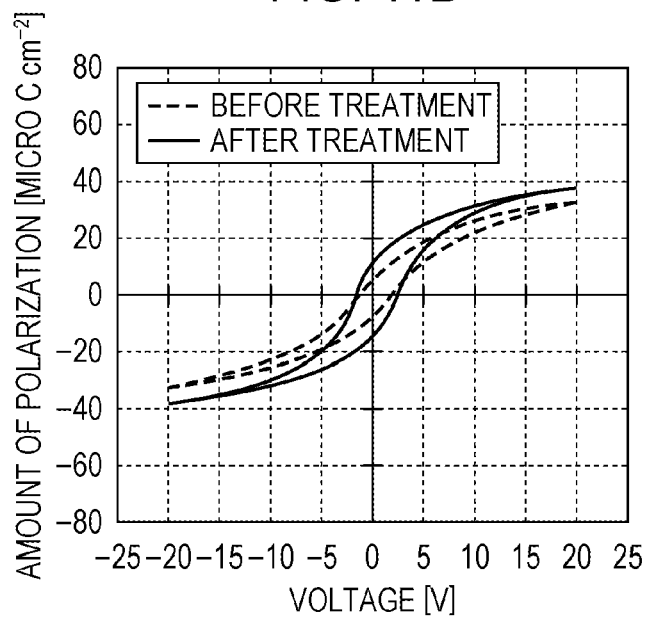
FIG. 11B is a view that describes a relationship between an amount of polarization (P) and a voltage (E) of a piezoelectric element according to an Example.

In Examples 1 to 6 and Comparative Examples 1 and 2, a relationship (a P-V loop) between an amount of polarization (microC cm$^{-2}$) and an electric field (V) is determined by applying a triangular waveform with a frequency of 1 kHz at room temperature using an electrode pattern in which phi=500 micrometers using an "FCE-1A" manufactured by Toyo Corporation. FIG. 11A shows a P-V loop in which Example 1 was measured at plus-minus 20 V (broken line: prior to wake-up process), and a P-V loop in which Example 1 was measured at plus-minus 20 V after the wake-up process of plus-minus AC 45 V (solid line: after wake-up process). In the same manner, FIG. 11B shows measurement results of Example 3. According to Examples 1 and 3, a P-V loop changes as a result of the wake-up process, and the amount of polarization changes, more the smaller the composition of x is. The reason for this is that a ratio of a c axis component increases as a result of components inside a 90 degree domain being activated.

Table 1 shows a residual amount of polarity ($P_r$) in Examples 1 to 6 and Comparative Examples 1 and 2 determined from hysteresis after the wake-up process. As shown in Table 1, it is clear that the residual amount of polarity increases monotonously with increases in a ratio of $PbTiO_3$.

X-Ray Diffraction Measurement Using Two Dimensional Detector

The crystalline structure and orientation of Examples 1 to 6 and Comparative Examples 1 and 2 were measured using two dimensional mapping images and diffraction patterns by using a "D8 Discover" manufactured by Bruker AXS Corporation with CuK alpha as a radiation source, and a two dimensional detector (GADDS) as a detector. Ranges that can be detected as an image as a result of the restrictions of the device configuration are 2 theta=22.5 degrees Celcius corresponding to phi=plus-minus 30 degrees at which a (100) peak is detected, 2 theta=32.5 degrees Celcius corresponding to phi=plus-minus 32 degrees at which a (110) peak is detected, and 2 theta=40 degrees Celcius corresponding to phi=plus-minus 26 degrees at which a (111) peak is detected.

Figure 12:
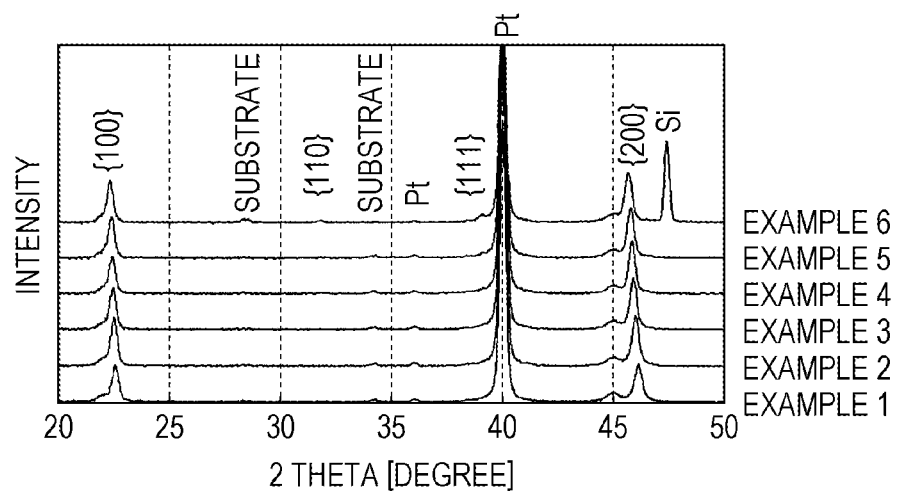
FIG. 12 is a view that describes X-ray diffraction patterns that are related to the piezoelectric element according to Embodiment 1.

FIG. 12 shows X-ray diffraction patterns of Examples 1 to 6 that are measured prior to form the second electrode 80. As shown in FIG. 12, only a peak derived from the substrate and a peak of the $ABO_3$ structure are observed in Examples 1 to 6, and heterogenous phases were not observed. Additionally, a peak of Si is observed in Example 6 only, but this is caused by a plane direction of the Si substrate, and therefore, does not have any particular effect. In the same manner, comparative examples 1 and 2 have also $ABO_3$ structures, and heterogenous phases were not observed.

Additionally, Example 1 was {100} oriented, and a diffraction pattern of a (001) plane, which is a c axis, and a diffraction pattern of a (100) plane, which is an a axis and a b axis are clearly observed separately. From this fact, the Examples 1 to 6 are proved to be tetragonal. In addition, Comparative Example 1 was {111} oriented, and Comparative Example 2 was {100} oriented.

Figure 13:
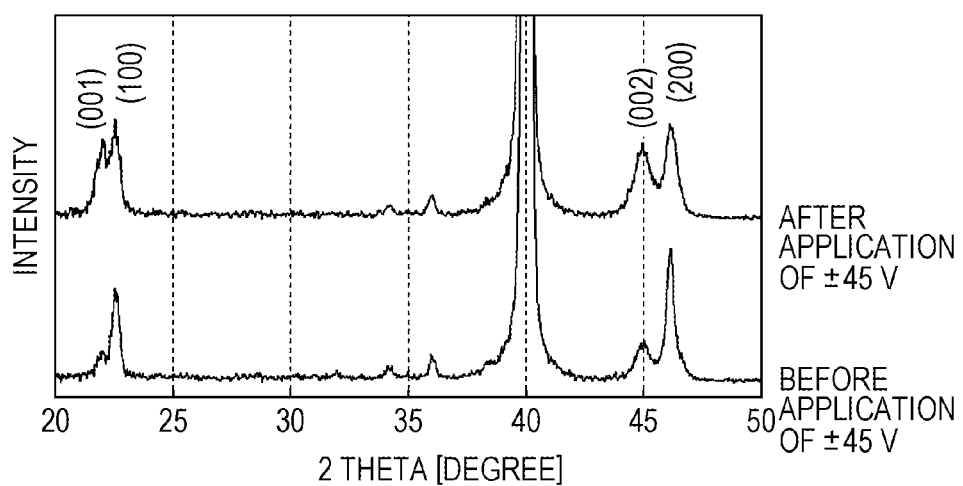
FIG. 13 is a view that describes X-ray diffraction patterns that are related to the piezoelectric element according to Embodiment 1.

FIG. 13 shows X-ray diffraction patterns of Example 1 before and after the wake-up process, that is, before and after the application of AC plus-minus 45 V. As shown in FIG. 13, it is clear that a peak intensity of a (200) plane is reduced, and a peak intensity of a (002) plane is increased as a result of the wake-up process. The reason for this is that oriented components perform a 90 degree inversion as a result of the wake-up process, and also retain a (002) orientation after the application of an electric field. From this, it is clear that a domain that is set to a (200) orientation is mobilized as a result of the wake-up process.

Compositional Dependence of Crystallite Diameter

It is well known that it is possible to evaluate the crystallite diameter from a line width (full width at half maximum: FWHM) of an XRD diffraction pattern. The Scherrer equation is represented by D=K lambda/B cos theta. In this equation, D is a crystallite size, K is a Scherrer's constant, lambda is a wavelength of X-rays (CuK alpha=1.5418 angstrom), B is a line width of a specimen in which a device-specific line width is subtracted from the FWHM, and theta is a Bragg angle (half of a diffraction angle 2 theta).

In the present embodiment, K uses K=0.63661 defined by a volume weighted average thickness, and the device-specific line width uses a line width $B_{si}$=0.19918 in which standard silicon specimen is measured with an XRD device.

Figure 14A:
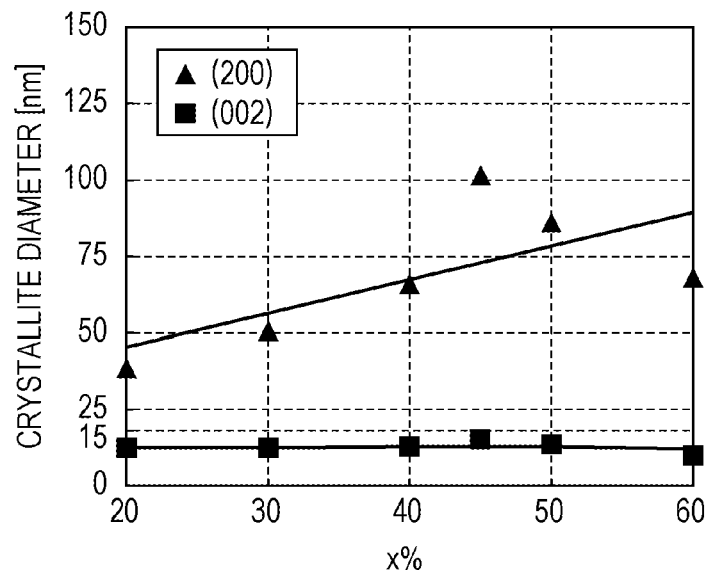
FIG. 14A is a view that describes a compositional dependence of a crystallite diameter of a piezoelectric element according to an Example.
Figure 14B:
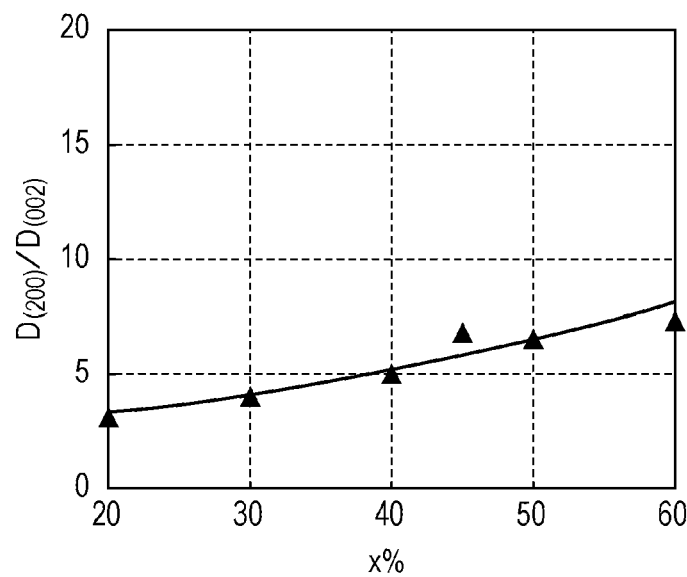
FIG. 14B is a view that describes a compositional dependence of a crystallite diameter of a piezoelectric element according to an Example.

FIG. 14A shows compositional dependence of a crystallite diameter of a (200) plane and a (002) plane that are determined from a diffraction pattern using the Scherrer's constant, and FIG. 14B shows compositional dependence of a ratio ($D_{(200)}/D_{(002)}$) of a crystallite diameter $D_{(200)}$ of a (200) plane and a crystallite diameter $D_{(002)}$ of a (002) plane. As shown in FIG. 14A, in Examples 1 to 6, the crystallite diameter of the (002) plane is smaller than the crystallite diameter of the (200) plane, and is less than or equal to 15 nm. Meanwhile, as shown in FIG. 14B, the crystallite diameter of the (200) plane is 3 to 16 times the size of the crystallite diameter of the (002) plane.

Lattice Matching Performance with Foundation Layer

It is well-known that lattice matching performance with the foundation layer 70a is important in orientation control in the main layer 70m of the piezoelectric body layer 70. Table 2 shows a lattice mismatching rate of a (200) peak of PZT, which is the foundation layer 70a, and (002) and (200) peaks of PMN-PT, which are the main layer 70m. Additionally, the lattice mismatching rate determines a d value on the basis of 2d sin theta=n lambda, which is a Bragg condition, and is determined as an absolute value of a difference with the d value.

As shown in Table 2, a lattice mismatching rate in the (002) component of PMN-PT has an extremely favorable lattice matching performance of 0.01 to 0.09%. Meanwhile, the (200) component has a lattice mismatching performance of 1.15 to 2.31%. From this, it is understood that it is possible to obtain a PMN-PT that has the (002) component with favorable lattice matching performance by making the PZT constituting the foundation layer 70a to have a function of {100} orientation control layer.

DBLI Measurement

In Examples 1 to 6 and Comparative Examples 1 and 2, a relationship between an electric field induced amount of strain and voltage in a unipolar mode is determined using a displacement measurement device (DBLI) manufactured by Exact Corporation. Measurement is performed with a measurement temperature set as room temperature (25 degrees Celcius), an electrode pattern set to phi=500 micrometers, a waveform set to a triangular waveform, and frequency set to a frequency of 1 kHz.

Figure 15:
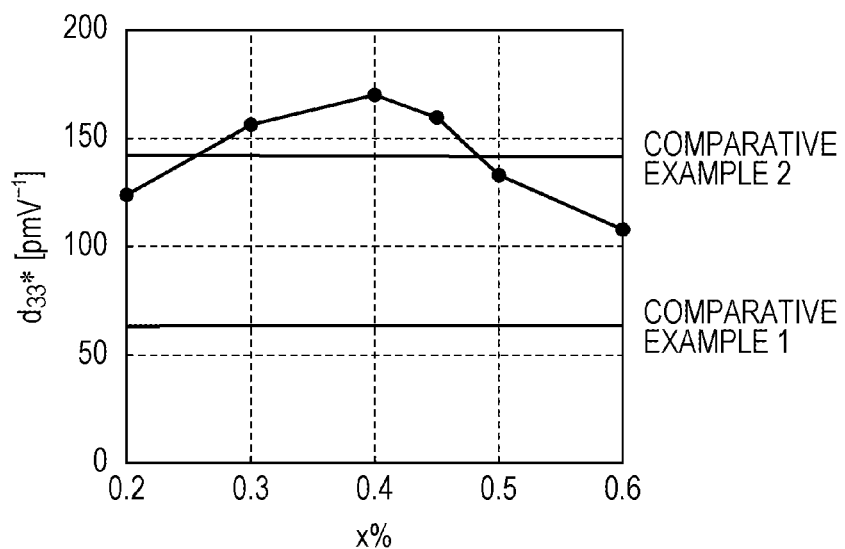
FIG. 15 is a view that describes a compositional dependence of an electric field induced strain constant of a piezoelectric element according to an Example.

FIG. 15 shows a compositional dependence of an electric field induced strain constant ($d_{33}$*) determined with DBLI. As shown in FIG. 15, it is clear that all of Examples 1 to 6 show favorable piezoelectric performance that exceeds 100 pm $V^{-1}$, which is higher than the 62 pm $V^{-1}$ of Comparative Example 1. From this, it is clear that high piezoelectric performance is shown in {100} oriented PMN-PT. Furthermore, it is clear that extremely high piezoelectric performance that exceed the $d_{33}$*=142 pm $V^{-1}$ of the PZT of Comparative Example 2 are shown in Example 2 (x=0.30), Example 3 (x=0.40) and Example 4 (x=0.45).

In this manner, the reason why {100} oriented PMN-PT shows particularly high piezoelectric performance is due to 90 degree domain rotation. In the abovementioned manner, PMN-PT has a comparatively large c/a of 1.026 to 1.015, and it is clear that an electric field response in which the fact that a ratio of a (100) component and a (001) component changes as a result of the wake-up process can be understood, is shown. This kind of electric field response is caused by a polarization axis of a (100) component being orthogonal to the electric field. Meanwhile, in a case of {111} orientation in the manner of Comparative Example 1, a polarization axis is inclined from the electric field, and an angle is drawn together by the (100) component and the (001) component. Therefore, the effect received from the electric field is small, it becomes more difficult for 90 degree domain rotation to occur, and the electric field induced strain constant is also reduced as a result.

TABLE 1

| | Composition (Orientation) | (1 − x) | alpha | Film Thickness nm | c/a | Pr microC/cm$^2$ | epsilon$_r$ | d$_{33}$ pm/V |
|---|---|---|---|---|---|---|---|---|
| Example 1 | PMN-PT {100} | 0.80 | 1.14 | 512 | 1.026 | 25.6 | 596 | 124 |
| Example 2 | PMN-PT {100} | 0.70 | 1.14 | 547 | 1.022 | 23.2 | 742 | 156 |
| Example 3 | PMN-PT {100} | 0.60 | 1.14 | 560 | 1.018 | 13.5 | 1007 | 170 |
| Example 4 | PMN-PT {100} | 0.55 | 1.14 | — | 1.015 | 14.9 | — | 160 |
| Example 5 | PMN-PT {100} | 0.50 | 1.14 | 556 | 1.015 | 11.4 | 1369 | 133 |
| Example 6 | PMN-PT {100} | 0.40 | 1.14 | 722 | 1.016 | 6.3 | 1647 | 108 |
| Comparative Example 1 | PMN-PT {111} | 0.80 | 1.14 | 393 | — | 27.4 | 452 | 62 |
| Comparative Example 2 | PZT {100} | — | — | 1270 | — | 16.4 | 1627 | 142 |

TABLE 2

| | (002) Mismatching Rate % | (200) Mismatching Rate % |
|---|---|---|
| Example 1 | 0.01 | 2.31 |
| Example 2 | 0.01 | 2.07 |
| Example 3 | 0.03 | 1.87 |
| Example 4 | 0.03 | 1.74 |
| Example 5 | 0.09 | 1.43 |
| Example 6 | 0.02 | 1.15 |

As a result of the above, according to a piezoelectric element 300 of Examples 1 to 6 in which a crystal that configures the piezoelectric body layer 70 has a tetragonal structure, the crystal is {100} oriented on the substrate, and each region, which has a (100) plane and a (001) plane that are perpendicular with respect to a direction of lamination, is mixed inside a lattice of the crystal, it is possible to improve a piezoelectric constant, and therefore, it is understood that a piezoelectric element with an excellent piezoelectric characteristic can be obtained.

Example 7

A piezoelectric element 300A is provided using the same processes as Example 1 other than forming a foundation layer comprised of two layers. A titanium film is formed on the first electrode pattern using a sputtering method, and a ceramic film (the foundation layer 70b) comprised of PZT is formed on the titanium film using the same sequence as the sequence with which the foundation layer 70a is formed. Further, the main layer 70m comprised of nine layers of ceramic film (the precursor film 74) is formed on the ceramic films (the foundation layers 70a and 70b), thereby a piezoelectric element 300A having a piezoelectric body layer 70 comprised of foundation layers 70a and 70b and the main layer 70m is obtained. Further, a piezoelectric actuator that includes the piezoelectric element 300A is provided.

Comparative Example 3

A piezoelectric actuator that includes a piezoelectric element is provided using the same processes as Example 7 other than forming the entire piezoelectric body layer 70 from PZT.

Evaluation Content 2
Shape Observation

A machined shape in Example 7 and Comparative Example 3 is measured using SEM. The result is that a significant difference in a specific shape that could bring about an effect on characteristics is not observed in Example 7 and Comparative Example 3. Additionally, a measured value that was obtained by the SEM observation was used in the calculation of the Young's modulus that will be mentioned later.

Displacement of Vibration Plate

The displacement of the vibration plate was measured at room temperature (25 degrees Celcius) using an NLV-2500 manufactured by Polytec GmbH for piezoelectric actuators of Example 7 and Comparative Example 3. Measurement conditions were a trapezoid wave with a frequency of 1 kHz, and a difference in potential was measured at 25 V. The result was that an amount of the displacement of the vibration plate of Example 7 was 519 nm, and an amount of the displacement of the vibration plate of Comparative Example 3 was 391 nm. This result confirmed that there was an improvement of 33% in the amount of displacement in Example 7 in comparison with Comparative Example 3.

[Measurement of Resonance Frequency]

A frequency dependence of an impedance was measured at room temperature (25 degrees Celcius) using a "4294A" manufactured by Hewlett-Packard Company for a piezoelectric actuator of Example 7. Measurement was performed with an application voltage of 5 plus-minus 0.5 V, and a measurement frequency in a range of 1 MHz to 4 MHz.

Figure 16:
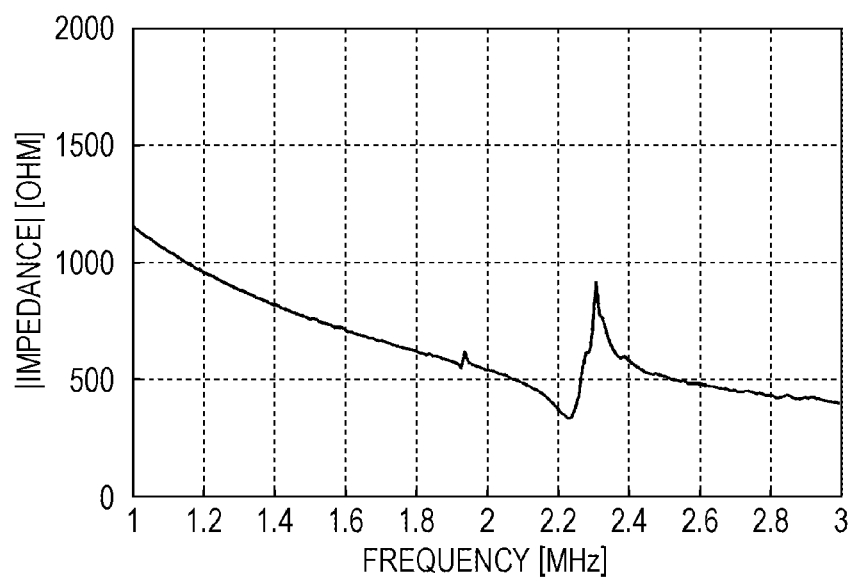
FIG. 16 is a view that shows a frequency dependence of an impedance of a piezoelectric element according to an Example.

FIG. 16 shows a frequency dependence of an impedance in Example 7. As shown in FIG. 16, in a piezoelectric actuator of Example 7, changes in the impedance derived from resonance and antiresonance of the vibration plate were observed at approximately 1.95 MHz and approximately 2.27 MHz.

Identification of Resonance Mode

A resonance mode of the vibration plate was identified in a resonance state at room temperature (25 degrees Celcius) using an NLV-2500 manufactured by Polytec GmbH for a piezoelectric actuator of Example 7. An input wave used a Sin wave of 5 plus-minus 0.5V, and an amount of displacement and a phase were measured at arbitrary locations in a vibration plate to which a voltage is applied (an ON segment) and adjacent vibration plates (adjacent segments).

Figure 17:
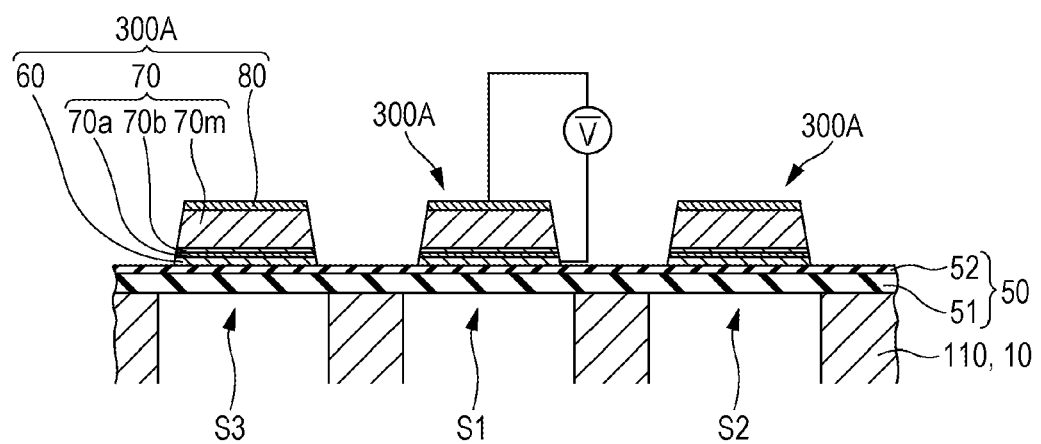
FIG. 17 is a schematic view of a configuration for identifying a resonance mode.

FIG. 17 shows a schematic view for identifying a resonance mode. A vibration plate is provided on a substrate in which a plurality of spaces are formed, piezoelectric elements are respectively arranged on the vibration plate so as to correspond to the spaces, and a phase and an amount of displacement (in particular, a peak amount of displacement derived from resonance) are observed at both adjacent segments S2 and S3 when a voltage is applied to a piezoelectric element with a predetermined ON segment S1 set as the target. The figure is merely a schematic drawing, and in practice, a resonance mode is identified using a piezoelectric actuator configured in the same manner as Example 7. The result of measurement using this kind of method was that a peak in an amount of displacement derived from resonance was observed in the ON segment S1 and both adjacent segments S2 and S3 at approximately 1.93 MHz and approximately 2.25 MHz in the piezoelectric actuator of Example 7. Additionally, by measuring the phase, it was clear that 1.93 MHz was a resonance state in which the ON segment and the adjacent segments move in an antiphase (an antiphase mode), and 2.25 MHz was a resonance state in which the ON segment and the adjacent segments move in a coordinate phase (a coordinate phase mode).

Additionally, from the fact that the abovementioned antiphase mode and coordinate phase mode show favorable consistency with an impedance change that was observed in the frequency dependency of the impedance, it was understood that the same states were being observed.

Furthermore, when the measurement was performed in the same manner for the piezoelectric actuator of Comparative Example 3, a coordinate phase mode at approximately 3.10 MHz was confirmed.

Calculation of Young's Modulus of Piezoelectric Body Layer

Firstly, a resonance frequency of the coordinate phase mode was calculated from a measured value of a piezoelectric actuator shape that was determined from. SEM observation, and a Poisson's ratio of the Young's modulus of each member ($SiO_2$, $ZrO_2$, Ti, Pt, Ir and PZT). Additionally, calculation was performed in two dimensions, and was calculated by taking a waveform of the ON segment and the adjacent segments into account.

FIGS. 18A and 18B show a result of a vibration mode calculation using an actuator design value. As shown in FIGS. 18A and 18B, it was possible to reproduce the coordinate phase mode and the antiphase mode that were observed during actual driving with a calculation. Next, resonance frequency of the piezoelectric actuator of Comparative Example 3 was analyzed from the shape that was determined by SEM observation. The result was that the resonance frequency of the coordinate mode was 3.080 MHz, and showed extremely favorable consistency with 3.10 MHz, which is a measured value. From this finding, it can be said that calculated parameters that are used in the present calculation and calculation methods appropriate.

Next, the Young's modulus of the entire piezoelectric body layer 70 (the main layer 70m comprised of PMN-PT and the foundation layers 70a and 70b that are formed from PZT) was calculated for Example 7 from a measured value of a piezoelectric actuator shape, and measured values of a Poisson's ratio of the Young's modulus of each member and a resonance frequency. Additionally, since the effect of Poisson's ratio in the calculation of the Young's modulus is minimal, the same value as PZT was used as the Poisson's ratio.

The result was that the Young's modulus of the entire piezoelectric body layer 70 was an extremely low of 24% of PZT. Additionally, the Young's modulus referred to in this instance is the Young's modulus in a short mode in which piezoelectric performance has been taken into account.

[Young's Modulus Measurement in Open Mode]

Nano indenter measurement using a UMIS-2000 manufactured by the Commonwealth Scientific and Industrial Research Organisation is carried out in order to measure Young's modulus in an open mode. The result was that in the piezoelectric actuator of Comparative Example 3, the Young's modulus in a short mode was 61% of the Young's modulus in an open mode.

Meanwhile, in the piezoelectric actuator of Example 7, the Young's modulus in a short mode was less than or equal to 50% of the Young's modulus in an open mode, and more specifically, was 14%. The reason for this is that, in the entire piezoelectric body layer 70 according to Example 7, 90 degree domain rotation occurs in the main layer 70m comprised of PMN-PT as a result of stress induction, the majority of mechanical energy that results therefrom is converted into electrical energy, and therefore, the Young's modulus in a short mode greatly reduced. Meanwhile, in an open mode, since an electric charge is not exposed to the outside, and therefore, electromechanical conversion does not occur, a reduction in the Young's modulus that caused by a piezoelectric effect in the manner seen in the measurement of a short mode does not occur.

Further, since a piezoelectric element, in which the Young's modulus of the entire piezoelectric body layer in a short mode is less than 25% of a Young's modulus of the foundation layer in a short mode in the manner exemplified in Example 7 is set as a piezoelectric element in which the rigidity of the entire piezoelectric body layer is low, it can be said that it is possible to achieve an improvement in a piezoelectric characteristic as a result of an improvement in a piezoelectric constant.

OTHER EMBODIMENTS

An embodiment of a piezoelectric element, a liquid ejecting head in which a piezoelectric element is installed and a liquid ejecting apparatus of the present invention has been described above, but the basic configuration of the present invention is not limited to the descriptions mentioned above. For example, in the abovementioned embodiment, a silicon monocrystalline substrate was illustrated as an example of the flow channel formation substrate 10, but the configuration thereof is not particularly limited, and for example, may use an SOI substrate or a material such as glass.

In addition to the abovementioned embodiment, it is possible to configure an ultrasonic wave measurement apparatus by providing the piezoelectric element of the present invention, and control means for measuring a detection target using a signal based on at least one of ultrasonic waves that are transmitted by the piezoelectric element, and ultrasonic waves that are received by the piezoelectric element.

This kind of ultrasonic wave measurement apparatus is an apparatus that obtains information related to the position, the shape and the speed of a measurement target on the basis of a time from a time point at which ultrasonic waves are transmitted to a time point at which an echo signal, in which transmitted ultrasonic waves return by being reflected by the measurement target, is received, and there are cases in which piezoelectric elements are used in elements for generating ultrasonic waves and elements for detecting echo signals. If the piezoelectric element of the present invention in which an improvement in a piezoelectric constant is achieved is used as this kind of ultrasonic wave generation element or echo signal detection element, it is possible to provide an ultrasonic wave measurement apparatus in which an ultrasonic wave generation efficiency or an echo signal detection efficiency is improved.

In addition, in the abovementioned embodiment, description was given using an ink jet type recording head as an example of a liquid ejecting head, but the invention can be widely applied to general liquid ejecting heads, and naturally, can be applied to a liquid ejecting heads that eject liquids other than ink. Examples of other liquid ejecting heads include various recording heads that are used in image recording apparatuses such as printers, color material ejecting heads that are used in the production of color filters such as liquid crystal displays, electrode material ejecting heads that are used in electrode formation such as organic EL displays, Field Emission Displays (FEDs) and the like, and living organic material ejecting heads that are used in the production of biochips.

In addition, the piezoelectric element of the present invention is not limited to a piezoelectric element used in a liquid ejecting head, and also be used in other devices. Examples of other devices include ultrasonic wave devices such as ultrasonic wave transmitters, ultrasonic wave motors, temperature-electricity converters, pressure-electricity converters, ferroelectric transistors, piezoelectric transformers, screening filters of harmful rays such as infrared rays, optical filters that use a photonic crystal effect of quantum dot formation, a filter of an optical filter or the like that uses an optical interference film and the like. In addition, the present invention can also be applied to piezoelectric elements that are used as sensors, and piezoelectric elements that are used as ferroelectric memory. Examples of sensors in which a piezoelectric element can be used include infrared sensors, ultrasonic wave sensors, thermal sensors, pressure sensors, pyroelectric sensors, and gyro sensors (angular velocity sensors).

In addition, the piezoelectric element 300 of the present invention can be suitably used as a ferroelectric body. Examples of ferroelectric bodies in which it is possible to use the present invention suitably include ferroelectric transistors (FeFET), ferroelectric arithmetic circuits (FeLogic), ferroelectric capacitors and the like. Furthermore, since the piezoelectric element 300 of the present embodiment has favorable pyroelectric characteristics, it is possible to use the piezoelectric element 300 suitably in pyroelectric elements. Examples of pyroelectric elements in which it is possible to use the present invention suitably include temperature detectors, biological detectors, infrared detectors, terahertz detectors, heat-electricity converters and the like.

The present invention was described above, but in particular, according to the abovementioned embodiment, by using displacement caused by 90 degree domain rotation, it is possible to configure a piezoelectric element that has a high electrical-mechanical conversion performance, highly sensitive stress detection performance, highly sensitive vibration detection performance and vibration generation performance, and therefore, it is possible to configure a piezoelectric element in which the rigidity of the entire piezoelectric body layer is set to be low. Moreover, by using displacement caused by 90 degree domain rotation, and setting the rigidity of the entire piezoelectric body layer is set to be low, it is possible to configure a high-precision liquid ejecting head in which various droplet size controls are possible, and a liquid ejecting head that is capable of handling highly viscous liquid. Furthermore, by using displacement caused by 90 degree domain rotation, and setting the rigidity of the entire piezoelectric body layer is set to be low, it is possible to configure a high output ultrasonic wave transmitter, a high dynamic range ultrasonic wave transmitter, a compact highly-integrated ultrasonic wave transmitter, a low heat ultrasonic wave transmitter, and a low power consumption ultrasonic wave transmitter. Further, by using displacement caused by 90 degree domain rotation, and setting the rigidity of the entire piezoelectric body layer is set to be low, it is possible to configure a highly-sensitive ultrasonic wave detector, a high S/N ratio ultrasonic detector, an ultrasonic detector in which depth detection is possible, and a low power consumption ultrasonic detector.

The invention claimed is:

1. A piezoelectric element comprising:
    a substrate;
    a first electrode provided on the substrate;
    a piezoelectric body layer provided on the first electrode and comprised of a crystal of a composite oxide having a perovskite structure including Pb, Nb and Ti; and
    a second electrode provided on the piezoelectric body layer,
    wherein the crystal has a tetragonal structure and is {100} oriented to the substrate, and
    a first region having a (100) plane and a second region having a (001) plane that are perpendicular with respect to a direction of lamination of the first electrode, the piezoelectric body and the second electrode, are mixed inside a lattice of the crystal.

2. The piezoelectric element according to claim 1, wherein the composite oxide that configures a layer of at least a portion of the piezoelectric body layer is represented by:

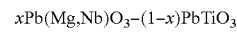

$x\text{Pb}(\text{Mg},\text{Nb})\text{O}_3-(1-x)\text{PbTiO}_3$ wherein x is more than or equal to 0.20 and less than or equal to 0.60.

3. The piezoelectric element according to claim 1, wherein a crystallite diameter $D_{(002)}$ of the crystal is less than or equal to 15 nm.

4. The piezoelectric element according to claim 1, wherein a ratio ($D_{(200)}/D_{(002)}$) of a crystallite diameter $D_{(200)}$ and a crystallite diameter $D_{(002)}$ in the crystal is greater than 3.

5. The piezoelectric element according to claim 1,
    wherein the piezoelectric body layer includes a foundation layer formed on the first electrode and a main layer provided on the foundation layer.

6. The piezoelectric element according to claim 5, wherein the foundation layer has a lattice matching performance of less than 1% with a c axis of the composite oxide that configures the main layer, and has a lattice mismatching performance of greater than or equal to 1% with an a axis and a b axis of the composite oxide that configures the main layer.

7. The piezoelectric element according to claim 5, wherein a dielectric constant of the main layer is smaller than a dielectric constant of the foundation layer.

8. The piezoelectric element according to claim 5, wherein a ratio c/a of the c axis and the a axis of the composite oxide that configures the main layer is 1.026 to 1.015.

9. The piezoelectric element according to claim 5, wherein the foundation layer is comprised of PZT.

10. The piezoelectric element according claim 5, wherein a Young's modulus of an entirety of the piezoelectric body layer in a short mode is less than 25% of a Young's modulus of the foundation layer in a short mode.

11. The piezoelectric element according to claim 10, wherein the Young's modulus of the entirety of the piezoelectric body layer in the short mode is less than or equal to 50% of a Young's modulus of the entirety of the piezoelectric body layer in an open mode.

12. The piezoelectric element according to claim 1, wherein the piezoelectric element is an ultrasonic wave transmission element.

13. A liquid ejecting head comprising the actuator device according to claim 12.

14. The piezoelectric element according to claim 1, wherein the piezoelectric element is an ultrasonic wave reception element.

15. A liquid ejecting apparatus comprising the liquid ejecting head according to claim 14.

16. An actuator device comprising the piezoelectric element according to claim 1.

17. An ultrasonic wave measurement apparatus comprising the piezoelectric element according to claim 1.

18. A piezoelectric element comprising:
a substrate;
a first electrode provided on the substrate;
a piezoelectric body layer provided on the first electrode and comprised of a crystal of a composite oxide having a perovskite structure including Pb, Nb and Ti; and
a second electrode provided on the piezoelectric body layer,
wherein the piezoelectric body layer includes a foundation layer formed on the first electrode and a main layer provided on the foundation layer, and
a Young's modulus of an entirety of the piezoelectric body layer in a short mode is less than 25% of a Young's modulus of the foundation layer in a short mode.

19. The piezoelectric element according to claim 18, wherein the Young's modulus of the entirety of the piezoelectric body layer in a short mode is less than or equal to 50% of a Young's modulus of the entirety of the piezoelectric body layer in an open mode.

* * * * *